(12) United States Patent
Misaka

(10) Patent No.: US 9,658,524 B2
(45) Date of Patent: May 23, 2017

(54) PHOTOMASK, AND METHOD FOR CREATING PATTERN DATA THEREOF, AND PATTERN FORMING METHOD AND PROCESSING METHOD USING PHOTOMASK

(71) Applicant: Panasonic Intellectual Property Management Co., Ltd., Osaka (JP)

(72) Inventor: Akio Misaka, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 73 days.

(21) Appl. No.: 14/825,299

(22) Filed: Aug. 13, 2015

(65) Prior Publication Data

US 2015/0346597 A1    Dec. 3, 2015

Related U.S. Application Data

(63) Continuation of application No. PCT/JP2013/005895, filed on Oct. 3, 2013.

(30) Foreign Application Priority Data

Feb. 22, 2013    (JP) .................. 2013-033122

(51) Int. Cl.
　　*G03F 1/38*　　(2012.01)
　　*G03F 1/36*　　(2012.01)
　　*G03F 1/50*　　(2012.01)
(52) U.S. Cl.
　　CPC .................. *G03F 1/38* (2013.01); *G03F 1/36* (2013.01); *G03F 1/50* (2013.01)
(58) Field of Classification Search
　　CPC ...................... G03F 1/38; G03F 1/26
　　See application file for complete search history.

(56) References Cited

U.S. PATENT DOCUMENTS

2007/0184361 A1* 8/2007 Misaka .................. G03F 1/32
　　　　　　　　　　　　　　　　　　　430/5

FOREIGN PATENT DOCUMENTS

JP　　2001-100389　　4/2001
JP　　2007-256880　　10/2007
(Continued)

OTHER PUBLICATIONS

International Search Report of PCT application No. PCT/JP2013/005895 dated Dec. 3, 2013.

*Primary Examiner* — Stephen Rosasco
(74) *Attorney, Agent, or Firm* — McDermott Will & Emery LLP

(57) ABSTRACT

A photomask includes: a light blocking member provided on a translucent substrate; a main pattern portion provided in a first region corresponding to a desired pattern, being an opening of the light blocking member; and an auxiliary pattern portion provided in a second region surrounding the position corresponding to the desired pattern and along a side constituting an outline portion of the desired pattern, including a plurality of in-phase auxiliary patterns each of which is an opening transmitting in-phase light with light transmitted through the main pattern portion. The in-phase auxiliary pattern is provided at a distance of $\sqrt{(2 \times n \times G \times \lambda)}$ from the side constituting the outline portion of the desired pattern (where G is a gap length between the photomask and the exposed body, $\lambda$ is a wavelength of the exposure light, and n is a natural number). The exposure light transmitted through the auxiliary pattern portion is projected on an exposed body to form a projection image having light intensity emphasized at the side constituting the outline portion of the desired pattern.

19 Claims, 36 Drawing Sheets

(56) References Cited

FOREIGN PATENT DOCUMENTS

| | | |
|---|---|---|
| JP | 2008-076724 | 4/2008 |
| JP | 2008-076940 | 4/2008 |
| JP | 2009-169255 | 7/2009 |
| JP | 2012-058324 | 3/2012 |

\* cited by examiner

PREFERABLE REGION WHERE AUXILIARY PATTERN IS ARRANGED

OUTWARD DIRECTION OF CONVEX CORNER

DESIRED PATTERN

PREFERABLE REGION OF OPENING HAVING PHASE OF 0°

DESIRED PATTERN

PRIOR ART

PRIOR ART

PRIOR ART

PRIOR ART

PRIOR ART

PRIOR ART

PRIOR ART

PHOTOMASK, AND METHOD FOR CREATING PATTERN DATA THEREOF, AND PATTERN FORMING METHOD AND PROCESSING METHOD USING PHOTOMASK

RELATED APPLICATIONS

This application is a Continuation of International Application No. PCT/JP2013/005895, filed on Oct. 3, 2013, which in turn claims priority from Japanese Patent Application No. 2013-033122, filed on Feb. 22, 2013, the contents of all of which are incorporated herein by reference in their entireties.

TECHNICAL FIELD

The present disclosure relates to a photomask, a method for producing pattern data thereof, and methods for forming and processing a pattern using the photomask, particularly to the photomask used in proximity exposure in which an interval between patterns is formed smaller than an exposable limit value of lithography.

BACKGROUND ART

Lithography is used in micro-fabrication of a semiconductor integrated circuit, MEMS (micro electro mechanical systems) processing, and processing of a surface of a liquid crystal flat panel. In the lithography, pattern exposure is performed on a photosensitive resin layer formed on a substrate to be processed, and the exposed photosensitive resin layer is developed to form an aimed pattern. In the lithography, generally the photosensitive resin layer is irradiated with light through the photomask in which the pattern is drawn. At this point, in order to prevent a flaw caused by a close contact of the photomask with an exposed body, the exposure is usually performed while a gap is provided between the photomask and the exposed body, namely proximity exposure is performed.

However, in the case that the gap is provided, a shape of the pattern is distorted due to a Fresnel diffraction phenomenon even if the pattern having several times size of a wavelength of exposure light is provided on the mask to form the fine pattern having several times size of the wavelength of exposure light. For this reason, there is a problem in that the pattern having the aimed size and shape can hardly be formed on a substrate of the exposed body. Specifically, even if an exposure light having a wavelength of 365 nm is used, only resolution ranging from about 4 µm to about 5 µm can be obtained when the gap of about 50 µm is provided between the mask and the exposed body. The size that is less than or equal to ten times the wavelength is extremely difficult to be formed when the gap of 50 µm or more, which is preferable from the viewpoint of production, is provided.

For example, in the case that the exposure is performed using exposure photomask 103 in which light blocking member 102 is formed on translucent substrate 101 as illustrated in FIG. 29, light 104 transmitted through photomask 103 is diffracted, and the pattern blurs until diffracted light 104 reaches substrate 105 of the exposed body.

However, nowadays a projection exposure method in which a projection lens is provided between photomask 103 and substrate 105 to be processed is occasionally used. In the projection exposure method, because a pattern image is transferred to the exposed body, the resolution can be obtained to a degree of the wavelength of exposure light. However, substantial cost is required for an exposure apparatus because a high-accuracy lens is required for the projection exposure method.

Therefore, there has been proposed a proximity exposure method in which, by devising the mask pattern, the resolution is improved to be able to expose the finer size at low cost.

Before the description of a pattern forming method performed to improve the resolution in the proximity exposure method, a cause of degrading the resolution in the conventional proximity exposure method is described (for example, see Unexamined Japanese Patent Publication No. 2001-100389).

FIGS. 30A to 30C illustrate states of the transfer image when a normal photomask is used in the conventional proximity exposure method. FIG. 30A illustrates desired pattern 110 having a square shape in a planar view, and pattern 110 is used as an opening of the photomask in the normal photomask. FIG. 30B illustrates a light intensity distribution of exposure image 110A when the exposure is performed using the photomask in which pattern 110 in FIG. 30A is formed. FIG. 30C illustrates pattern 110B obtained from exposure image 110A. As illustrated in FIG. 30C, each corner (angle) in formed pattern 110B projects outward, and each of four sides is recessed inward, thereby becoming a distorted shape. This is because the light intensity is increased by light interference in each corner. The distortion is also a cause to largely degrade the resolution in the proximity exposure.

On the other hand, in the projection exposure method, the mask pattern is corrected to improve the resolution of the transfer pattern. FIGS. 31A to 31D are plan views illustrating a typical mask pattern correction in the projection exposure method. FIG. 31A illustrates desired pattern 111 having a square shape in a planar view. FIG. 31B illustrates transfer image 111A expressing the light intensity distribution of the exposure image when the exposure is performed using a mask pattern having the shape identical to that of desired pattern 111 as the opening. FIG. 31C illustrates pattern 111B obtained from transfer image 111A. In the projection exposure method, the distortion is generated such that each corner of square pattern 111 is rounded to become a near-circular shape. As illustrated in FIG. 31C, the proximity exposure method totally differs from the projection exposure method in a typical distortion generated in the mask pattern having the identical shape. The distortion of the transfer image is caused by the interference between light beams transmitted through the mask opening in the proximity exposure method. On the other hand, in the projection exposure method, the distortion of the transfer image is attributed to the fact that the exposure light is transmitted through the opening of the mask having the size to a degree of a resolution limit, which is defined by a lens diameter and a wavelength of the exposure light, and the light that does not contribute to the image formation is generated. Therefore, in the projection exposure method, correction pattern 111C is used to widen an opening area as illustrated in FIG. 31D. In correction pattern 111C, opening 111c is added to the acute-angled corner of the opening pattern through which the exposure light is insufficiently transmitted. Opening 111c is an example of mask pattern correction referred to as serif. A number of mask correction methods are proposed in the projection exposure method (for example, see Unexamined Japanese Patent Publication No. 2001-100389).

As described above, because the proximity exposure method differs from the projection exposure method in the distortion principle of the transfer image, the resolution is not expected to be improved in the proximity exposure method from an analogy of the mask correction that is performed to improve the resolution in the projection exposure method.

The mask pattern correction performed to improve the resolution in response to the pattern distortion phenomenon generated in the proximity exposure method will be described below with reference to FIGS. 32A to 32C (for example, see Unexamined Japanese Patent Publication No. 2008-76940).

As illustrated in FIG. 32A, in photomask 112, second light blocking member 112b that is of a correction pattern is provided in a region including each corner along first light blocking member 112a and is provided inside opening 112c surrounded by first light blocking member 112a. Therefore, the distortion of the pattern shape by increasing the light intensity due to the light interference in each corner is prevented.

FIG. 32B is a view illustrating an effect of second light blocking member 112b of the correction pattern, and illustrating the light intensity distribution of the exposure image when the exposure is performed using photomask 112 in FIG. 32A. As can be seen from FIG. 32B, the portion in which the light intensity is increased by the light interference in each corner is eliminated compared with exposure image 111A in FIG. 30B. FIG. 32C illustrates pattern 112B obtained from exposure image 112A. Referring to FIG. 32C, although a high light-intensity portion caused by new interference emerges near a central portion of pattern 112A, the high light-intensity portion has a small influence on the shape of pattern 112A because the high light-intensity portion is located near the central portion of pattern 112A.

SUMMARY OF THE INVENTION

A photomask according to one aspect of the present disclosure includes: a translucent substrate; a light blocking member provided on the translucent substrate for blocking exposure light; a main pattern portion provided in a first region of the light blocking member corresponding to a desired pattern, the main pattern portion being an opening of the light blocking member; and an auxiliary pattern portion provided in a second region of the light blocking member surrounding a position corresponding to the desired pattern and along a side constituting an outline portion of the desired pattern, the auxiliary pattern portion including a plurality of in-phase auxiliary patterns, each of the plurality of in-phase auxiliary patterns being an opening of the light blocking member transmitting in-phase light in which a phase is matched with a phase of light transmitted through the main pattern portion. At this point, each of the plurality of in-phase auxiliary patterns is provided at a distance of $\sqrt{(2 \times n \times G \times \lambda)}$ from the side constituting the outline portion of the desired pattern, and the exposure light transmitted through the auxiliary pattern portion is projected on an exposed body to form a projection image having light intensity emphasized at the side constituting the outline portion of the desired pattern (where G is a gap length between the photomask and the exposed body, $\lambda$ is a wavelength of the exposure light, and n is a natural number).

The photomask according to one aspect includes the auxiliary pattern portion that has the plurality of in-phase auxiliary patterns, and each of the plurality of in-phase auxiliary patterns has the opening transmitting the in-phase light in which the phase is matched with that of the light transmitted through the main pattern portion. Therefore, the phases of the light beam transmitted through the in-phase auxiliary patterns are matched with each other in the outline portion of the desired pattern to increase intensity, so that the image having extremely high contrast in the outline portion of the desired pattern can be formed. Even in the proximity exposure method, the resolution can be considerably improved as fine as the projection exposure method.

In the photomask according to one aspect, the desired pattern may include a convex portion constructed with the side constituting the outline portion of the desired pattern, and, each of the plurality of in-phase auxiliary patterns has a decreased size in width near the convex portion or has an end of the in-phase auxiliary pattern terminated near the convex portion.

Therefore, the good processed shape having no distortion can be made in the convex portion of the desired pattern.

In the photomask according to one aspect, the plurality of in-phase auxiliary patterns may include a first in-phase auxiliary pattern provided adjacent to the main pattern portion with the light blocking part of the light blocking member interposed therebetween, and the first in-phase auxiliary pattern may be provided at a distance within $\sqrt{(2 \times G \times \lambda)}$ from the main pattern portion.

Therefore, the first in-phase auxiliary pattern that interferes most strongly with the light transmitted through the main pattern portion can surely be provided.

When the photomask according to one aspect includes the first in-phase auxiliary pattern, the first in-phase auxiliary pattern may have a width larger than a wavelength of the exposure light.

Therefore, the intensity of the light transmitted through the auxiliary pattern portion is sufficiently enhanced, so that high contrast can surely be obtained.

When the photomask according to one aspect includes the first in-phase auxiliary pattern, the main pattern portion may be a region having a size enlarged at least $(\sqrt{(2 \times G \times \lambda)})/8$ from the desired pattern.

Therefore, the light transmitted through the main pattern portion can sufficiently contribute to the interference at the outline portion of the desired pattern.

When the photomask according to one aspect includes the first in-phase auxiliary pattern, a width of the light blocking part between the main pattern portion and the first in-phase auxiliary pattern may be larger than a wavelength of the exposure light.

Therefore, the light having a bad influence on the interference at the outline portion of the desired pattern is prevented from being transmitted through the mask, so that the higher contrast can surely be obtained.

When the photomask according to one aspect includes the first in-phase auxiliary pattern, the auxiliary pattern portion may include a second in-phase auxiliary pattern provided adjacent to the main pattern portion with the first in-phase auxiliary pattern interposed therebetween, and the second in-phase auxiliary pattern may be provided at a distance within $\sqrt{(4 \times G \times \lambda)}$ from the main pattern portion.

Therefore, the light beams transmitted through the first and second in-phase auxiliary patterns interfere with each other at the outline portion of the desired pattern, so that the contrast can be improved.

In this case, a light blocking part of the light blocking member may be provided between the first in-phase auxiliary pattern and the second in-phase auxiliary pattern.

Therefore, the light having the bad influence on the interference between the in-phase auxiliary patterns is prevented from being transmitted through the mask, so that the higher contrast can surely be obtained.

In this case, the second in-phase auxiliary pattern may have a width smaller than a width of the first in-phase auxiliary pattern.

Therefore, the image in which the outline portion of the desired pattern is faithfully yielded can be formed.

In the photomask according to one aspect, a different-phase auxiliary pattern may be provided between the main pattern portion and the first in-phase auxiliary pattern, the different-phase auxiliary pattern being constructed with a phase shifter that transmits the exposure light with a phase different from a phase of the exposure light transmitted through the main pattern portion.

Therefore, the light interference is more correctly controlled at the outline portion of the desired pattern, so that the image having the faithful shape of the desired pattern can be formed.

In the photomask according to one aspect, a different-phase auxiliary pattern may be provided between the in-phase auxiliary patterns adjacent to each other, the different-phase auxiliary pattern transmitting the exposure light with a phase different from a phase of the exposure light transmitted through the main pattern.

Therefore, the light interference is more correctly controlled at the outline portion of the desired pattern, so that the image having the faithful shape of the desired pattern can be formed.

When a different-phase auxiliary pattern is provided in the photomask according to one aspect, the different-phase auxiliary pattern may transmit the exposure light with a phase opposite to a phase of the exposure light transmitted through the main pattern portion.

Therefore, the auxiliary pattern portion is substantially evenly provided without localizing in an outer peripheral portion of the desired pattern, so that an interval between the auxiliary patterns and the width of the auxiliary pattern can be increased.

In this case, a phase difference between the different-phase auxiliary pattern and the main pattern may fall within $180°\pm45°$.

Therefore, the interference effect of the light beams, which have different phases and are transmitted through the openings, can be improved.

In this case, the different-phase auxiliary pattern may have a width larger than a wavelength of the exposure light.

Therefore, the light having the opposite phase is sufficiently transmitted, so that the interference effect can be improved.

In this case, a light blocking part of the light blocking member may be provided between the in-phase auxiliary pattern and the different-phase auxiliary pattern.

Therefore, it can be restrained that the transmission of the light having the bad influence on the interference between the light transmitted through the auxiliary pattern having the same phase as the main pattern and the light transmitted through the auxiliary pattern having the opposite phase.

In this case, the light blocking part may have a width larger than a wavelength of the exposure light.

Therefore, the transmission of the light having the bad influence on the interference can be surely restrained.

In the photomask according to one aspect, the desired pattern may include a convex portion constructed with the side constituting the outline portion of the desired pattern, and the in-phase auxiliary patterns provided in parallel to the side may be decreased in number near the convex portion.

Therefore, the good processed shape having no distortion can be made in the convex portion of the desired pattern.

In the photomask according to one aspect, the desired pattern may include a thin line portion in which a line width is less than or equal to $\sqrt{(\lambda \times G)}$, and the plurality of in-phase auxiliary patterns may be provided along a side constituting the thin line portion.

Therefore, the line width that is hardly resolved with the conventional proximity exposure method can be formed.

In this case, the desired pattern may include a thick line portion that is coupled to the thin line portion, the line width of the thick line portion being greater than or equal to $\sqrt{(\lambda \times G)}$, and the plurality of in-phase auxiliary patterns may be provided along a side constituting the thick line portion.

Therefore, a pattern having an arbitrary shape including the line width that is hardly resolved with the conventional proximity exposure method can be formed.

According to another aspect of the present disclosure, a method for producing pattern data of the photomask includes the steps of: setting a mask pattern based on the desired pattern; calculating an amplitude distribution and a phase distribution on a propagation plane between a lens in projection exposure and the exposed body by using a wavelength and a numerical aperture of the exposure light; extracting a position where a predetermined phase is obtained in the surrounding of the desired pattern from the phase distribution to set a position where the auxiliary pattern is arranged; setting a pattern width of the auxiliary pattern in response to the amplitude distribution at the position where the predetermined phase is obtained; and outputting the auxiliary pattern having the predetermined phase as mask data, the position where the auxiliary pattern is arranged and the pattern width being set in the auxiliary pattern.

In the method according to another aspect for producing the pattern data of the photomask, the pattern data of the photomask that can form the image at which the outline portion of the desired pattern is emphasized can be produced with respect to an arbitrary pattern shape.

According to still another aspect, a method for forming the pattern using the photomask includes a step of preparing the substrate on which a resist film is formed, a step of irradiating the resist film with an exposure light through the photomask, and a step of forming a resist pattern by developing a resist film irradiated with the exposure light.

In the method for forming the pattern using the photomask, the light transmitted through the photomask is collected, so that the fine pattern can be formed.

According to yet another aspect, a processing method using the photomask includes a step of irradiating a material to be processed with a femtosecond laser beam through the photomask.

In the processing method using the photomask, the femtosecond laser beam is used as the light transmitted through the photomask, so that the material to be processed can be processed into a desired shape.

DESCRIPTION OF EMBODIMENTS

The mask pattern correction in the conventional proximity exposure method is a method for canceling a part of the light in which the interference of the light transmitted through the opening is emphasized. Therefore, the resolution is not basically improved although a certain effect to adjust the pattern shape is exerted.

The present disclosure provides a photomask that can considerably improve the resolution as fine as the projection exposure method, a method for producing pattern data of the photomask, and methods for forming and processing the pattern using the photomask in the proximity exposure method.

In a configuration of the present disclosure, the mask pattern of the photomask is produced such that the interference light is not canceled in the proximity exposure method, but a phenomenon of increasing light intensity by the interference is generated in an outline portion (outer frame portion) of the desired pattern.

First Exemplary Embodiment

A photomask according to a first exemplary embodiment will be described with reference to the drawings.

Figure 1A:
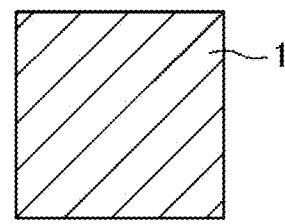
FIG. 1A is a plan view illustrating a desired pattern that is of a forming target of a photomask according to a first exemplary embodiment.
Figure 1B:
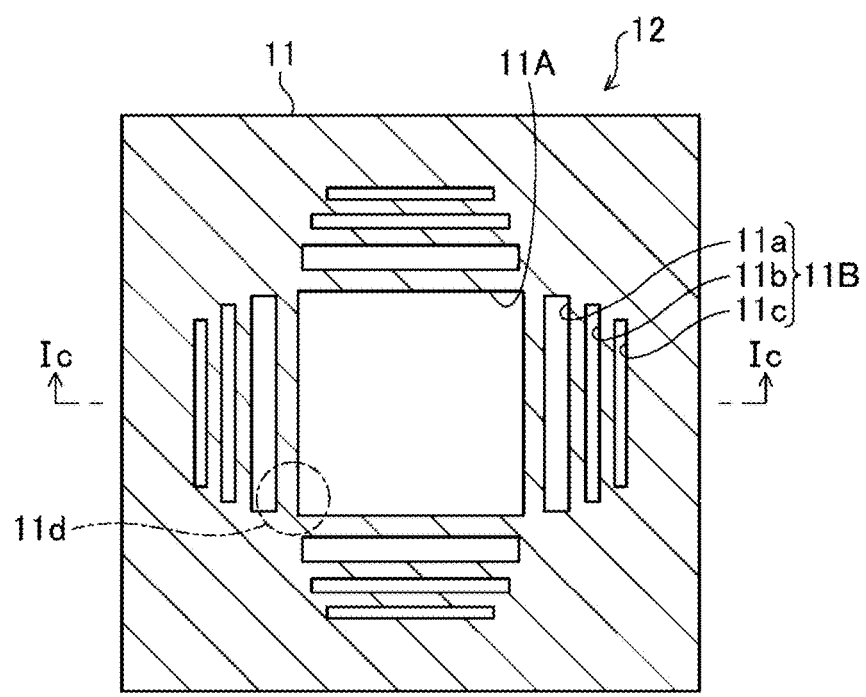
FIG. 1B is a plan view illustrating a rear surface side of the photomask of the first exemplary embodiment.
Figure 1C:
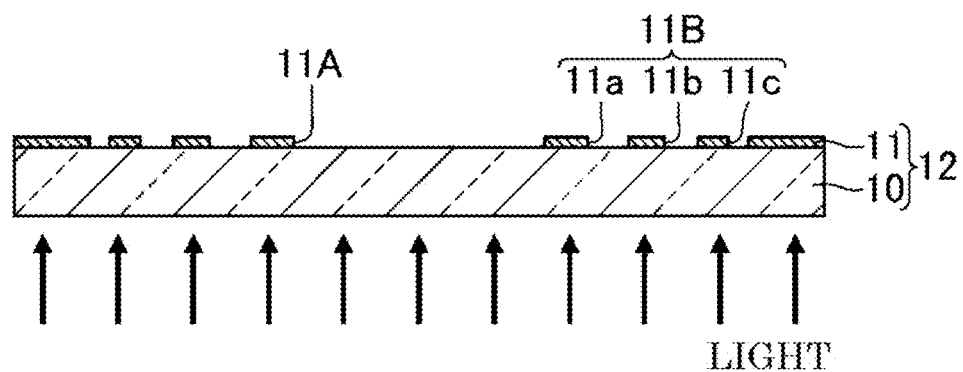
FIG. 1C is a sectional view at a line Ic-Ic in FIG. 1B.

FIG. 1A illustrates a planar configuration of a desired pattern of the first exemplary embodiment. FIG. 1B illustrates a layout of the photomask that makes the desired pattern, and FIG. 1C is a sectional view at a line Ic-Ic in FIG. 1B. At this point, desired pattern 1 is used synonymously with a design pattern.

As illustrated in FIGS. 1B and 1C, photomask 12 of the first exemplary embodiment includes translucent substrate 10 that transmits exposure light and light blocking member 11. Light blocking member 11 includes a light blocking film provided on a surface (rear surface) of translucent substrate 10 opposite to a surface (front surface) on which the exposure light is received.

For example, translucent substrate 10 is made of glass or quartz, and light blocking member 11 is made of a material, such as chromium (Cr), which has a light blocking property. Hereinafter, a portion that is covered with the light blocking material on the rear surface of photomask 12 is referred to as a light blocking part, and a portion that is not covered with the light blocking material is referred to as an opening. Hereinafter, unless otherwise noted, sometimes the translucent substrate is referred to as glass or quartz. However, translucent substrate 10 is not limited to the glass or quartz, and light blocking member 11 is not limited to the Cr film.

In light blocking member 11, main pattern portion 11A is provided at a position corresponding to a desired transfer pattern, and constructed with the opening having an outer shape substantially identical to that of desired pattern 1. Auxiliary pattern portion 11B is provided in a surrounding region of a linear side in the outline portion (or outline) of main pattern portion 11A corresponding to desired pattern 1, and constructed with a plurality of openings having substantially linear shapes. In the first exemplary embodiment, for example, auxiliary pattern portion 11B includes first auxiliary pattern 11a, second auxiliary pattern 11b, and third auxiliary pattern 11c, which are sequentially arranged from the side adjacent to main pattern portion 11A. Each of auxiliary patterns 11a to 11c has the following configuration such that, in performing the exposure using photomask 12, the light is collected in the outline portion of desired pattern 1 in the image projected to the exposed body (not illustrated) separated from photomask 12 by a predetermined distance.

First auxiliary pattern 11a, second auxiliary pattern portion 11b, and third auxiliary pattern 11c are configured such that width sizes of auxiliary patterns 11a to 11c decrease in this order with distance from main pattern portion 11A. An interval between respective center lines in an extending direction of the auxiliary patterns adjacent to each other decreases with distance from main pattern portion 11A. Specifically, the interval between a center line of second auxiliary pattern 11b and a center line of third auxiliary pattern 11c is smaller than the interval between a center line of first auxiliary pattern 11a and a center line of second auxiliary pattern 11b. Auxiliary pattern portion 11B is not provided in the region where the light intensity increases due to internal interference in the opening constituting main pattern portion 11A, namely, convex corner 11d in which the exposure light is collected. Auxiliary patterns 11a to 11c may decrease in number toward each convex corner 11d. That is, both end portions of each of auxiliary patterns 11a to 11c may be eliminated near convex corner 11d. In other words, a distance between an extended line of each side of main pattern portion 11A and the end portion in the extending direction of second auxiliary pattern 11b may be longer than a distance between the extended line and the end portion in the extending direction of first auxiliary pattern 11a.

In the first exemplary embodiment, by way of example, three auxiliary patterns 11a to 11c are provided in auxiliary pattern portion 11B along the sides constituting the outline portion of main pattern portion 11A. Alternatively, two or four auxiliary patterns may be provided in auxiliary pattern portion 11B. Each side of the main pattern portion and each side of auxiliary patterns 11a to 11c are linearly formed. Alternatively, for example, each side of the main pattern portion and each side of auxiliary patterns 11a to 11c may be formed into a substantially linear shape in which an uneven portion exists in a side portion. For the proximity exposure method, a value of uneven width size is not important in the uneven shape that emerges in a period less than or equal to a half of 4 μm of the resolution limit, but the uneven shape may be averaged to be considered. Convex corner 11d is one as the outer shape (outline portion), and the corner having a curvature radius smaller than at least the double resolution limit can more correctly be defined as convex corner 11d. For example, when the resolution limit is 4 μm in the proximity exposure method, convex corner 11d of the first exemplary embodiment has the curvature radius of 8 μm or less. However, in the proximity exposure method, correctly the resolution limit depends on wavelength λ of exposure light and gap length G. As used herein, gap length G means an interval between photomask 12 and the exposed body. The resolution limit of 4 μm is a practicable value in the proximity exposure method, for example, the value that simulates wavelength λ of 365 nm of exposure light and gap length G of 30 μm. The resolution can substantially be estimated by $\sqrt{(\lambda \times G)}$.

A principle of obtaining the good pattern by the proximity exposure method using photomask 12 in FIGS. 1B and 1C will be described below.

Figure 2A:
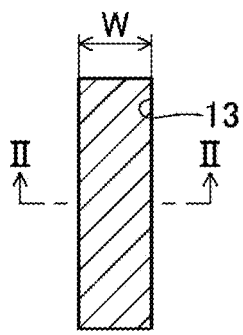
FIG. 2A is a plan view illustrating a phenomenon of a transfer image in a proximity exposure method.
Figure 2B:
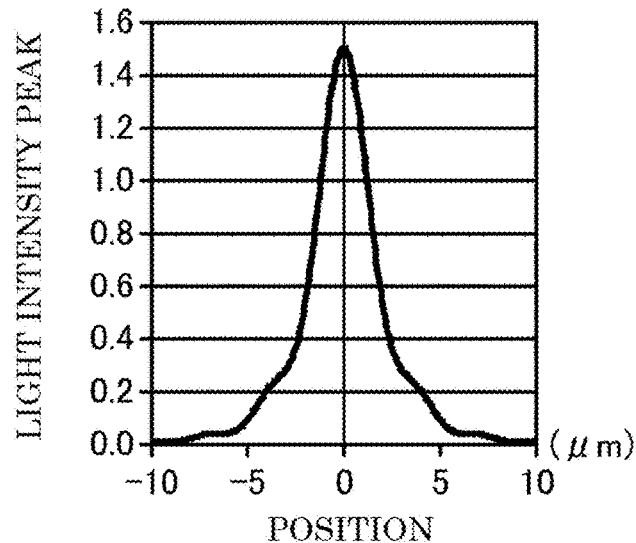
FIG. 2B is a graph illustrating the phenomenon of the transfer image in the proximity exposure method.
Figure 2C:
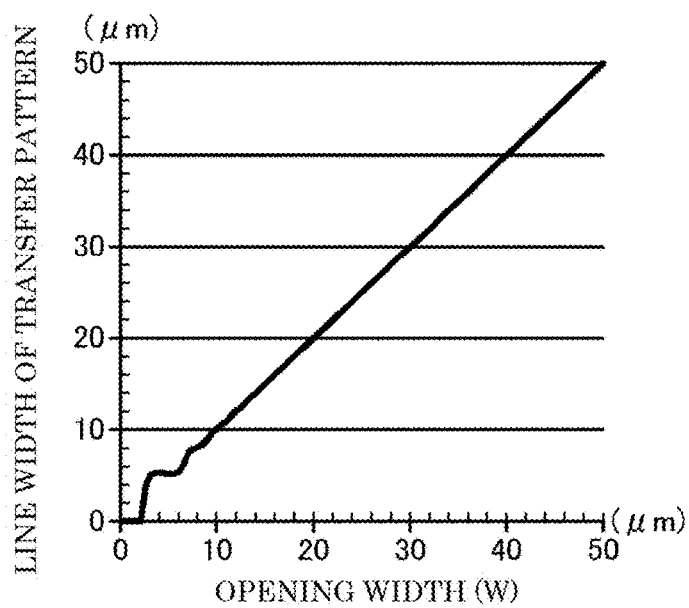
FIG. 2C is a graph illustrating the phenomenon of the transfer image in the proximity exposure method.

A phenomenon generated in performing the exposure through the photomask including opening 13 of the linear pattern will be described with reference to FIGS. 2A to 2D. FIG. 2A illustrates opening 13 on the photomask, and it is assumed that W is a width (hereinafter, referred to as an opening width) of opening 13. FIG. 2B illustrates a light intensity distribution that is formed on an exposed body (not illustrated) when the exposure is performed on the exposed body using the photomask having gap length G of 50 μm from the exposed body. FIG. 2B illustrates the light intensity distribution at wavelength λ of 365 nm of exposure light at the position corresponding to a line II-II in FIG. 2A. FIG. 2C is a graph in which a line width of the pattern transferred from the light intensity distribution with respect to opening widths W ranging from 0 μm to 50 μm. As can be seen from FIG. 2C, in the case that opening width W is larger than 6 μm, the line width of the transferred pattern changes in proportion, of substantially one to one, to opening width W. On the other hand, in the case that opening width W is less than 6 μm, the line width of the transferred pattern does not change even if opening width W decreases. In the case that opening width W further decreases, the line width of the transferred pattern decreases rapidly, but the transfer is not performed. Therefore, it is found that the pattern size of 6 μm or less is hardly formed by the above method. On the other hand, FIG. 2D is a graph in which the light intensity at the center position of the photomask having opening width W, specifically, the light intensity at the position of 0 μm indicated by the light intensity distribution in FIG. 2B is plotted with respect to opening widths W of 0 μm to 50 μm.

Figure 2D:
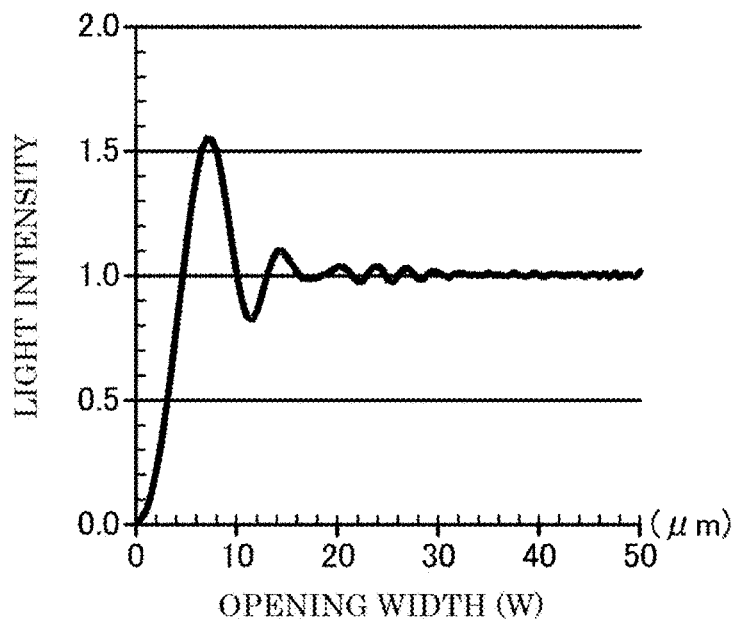
FIG. 2D is a graph illustrating the phenomenon of the transfer image in the proximity exposure method.

As can be seen from FIG. 2D, the light intensity increases with increasing opening width W in the region where opening width W is less than or equal to 6 μm, and the light intensity decreases with increasing opening width W in the region where opening width W is greater than or equal to 6 μm. It is also found that the light intensity converges to 1 when opening width W increases sufficiently. At this point, the light intensity is normalized such that the light intensity becomes 1 in the case that the whole surface of the exposed body is exposed, namely, in the case that the extremely large region is exposed. Unless otherwise noted, the light intensity is normalized.

FIGS. 3A to 3E illustrate detailed investigation results of the state in which opening width W ranges from 0 μm to 15 μm. When a profile of the light intensity distribution is investigated in detail for opening widths W of 0 μm to 15 μm, it is found that the distribution profiles differ from one another as illustrated in FIGS. 3A to 3E.

Figure 3A:
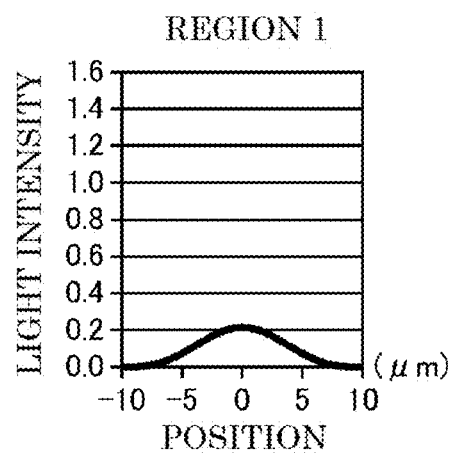
FIG. 3A is a graph illustrating the phenomenon of the transfer image in the proximity exposure method.
Figure 3B:
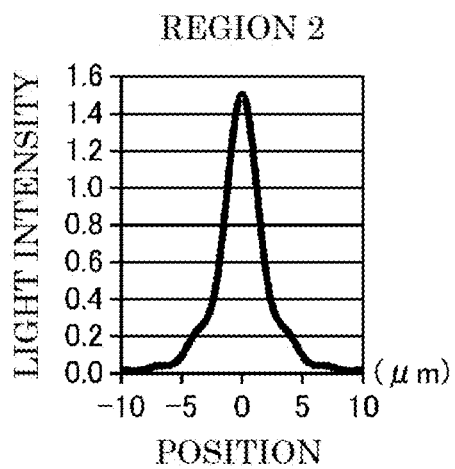
FIG. 3B is a graph illustrating the phenomenon of the transfer image in the proximity exposure method.
Figure 3C:
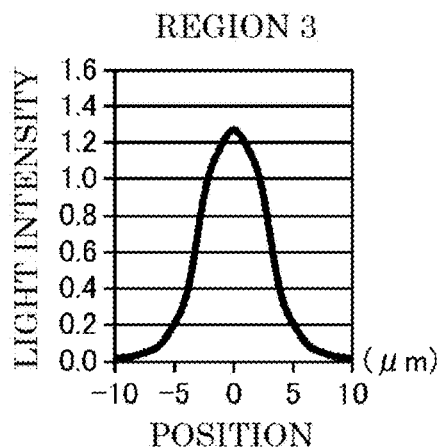
FIG. 3C is a graph illustrating the phenomenon of the transfer image in the proximity exposure method.
Figure 3D:
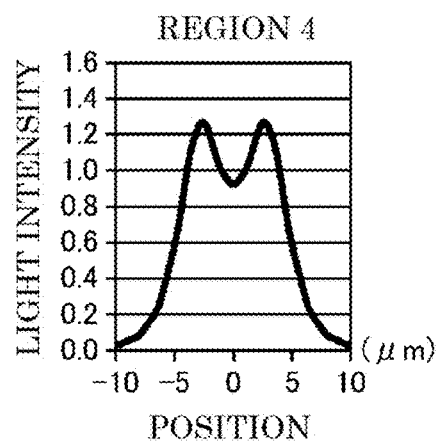
FIG. 3D is a graph illustrating the phenomenon of the transfer image in the proximity exposure method.
Figure 3E:
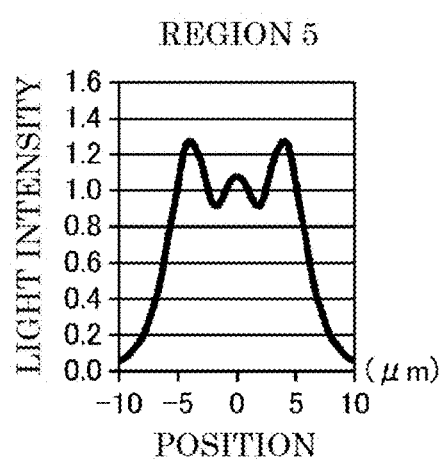
FIG. 3E is a graph illustrating the phenomenon of the transfer image in the proximity exposure method.
Figure 4A:
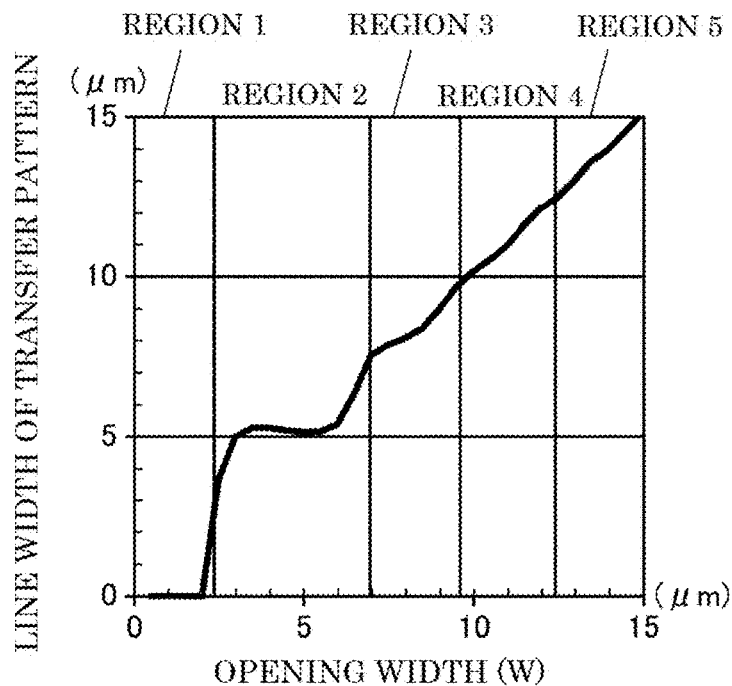
FIG. 4A is a graph illustrating the phenomenon of the transfer image in the proximity exposure method.
Figure 4B:
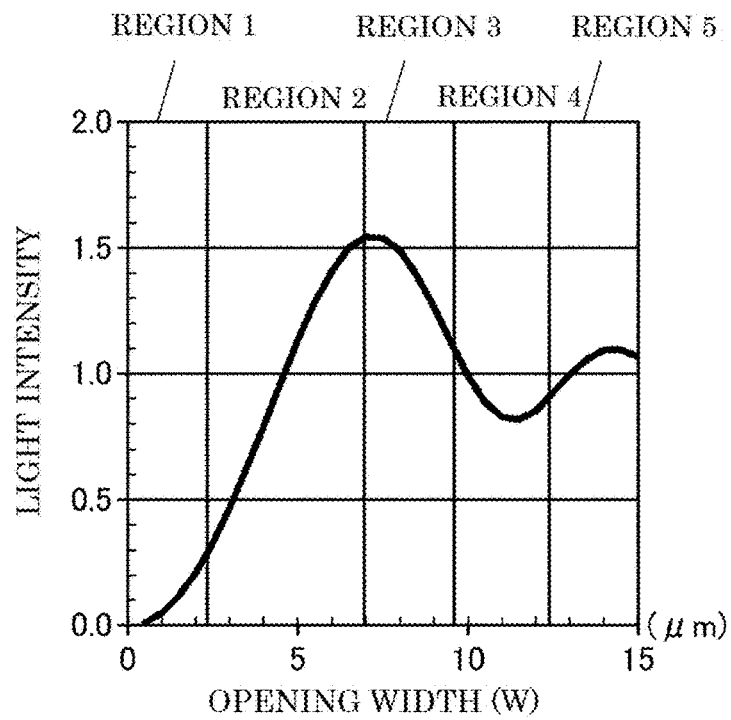
FIG. 4B is a graph illustrating the phenomenon of the transfer image in the proximity exposure method.

FIGS. 4A and 4B are enlarged views of FIGS. 2C and 2D illustrating the regions set to regions 1 to 5 having opening width W in which the distribution profiles in FIGS. 3A to 3E.

Region 1 in FIG. 3A has the profile in which a peak is located at the center position of opening 13 of the photomask. However, in region 1, as can be seen from FIG. 4A, the transfer pattern can hardly be formed due to the extremely low light intensity.

Region 2 in FIG. 3B has the profile in which the peak of the light intensity is located at the center position of opening 13, and the light intensity increases sufficiently to be able to form the transfer pattern. In region 2, although the peak of the light intensity increases with increasing opening width W as can be seen from FIG. 4B, the profile is not widened as can be seen from FIG. 4A. That is, region 2 is the state in which the line width of the transfer pattern does not increase even if opening width W increases. At this point, sometimes the peak of the light intensity becomes a value larger than 1.0.

Region 3 in FIG. 3C has the profile in which the peak is located at the center position of opening 13, and the light intensity increases sufficiently. However, in region 3, as can be seen from FIG. 4B, the peak of the light intensity decreases with increasing opening width W in contrast to the region 2. In region 3, as illustrated in FIG. 4A, although the peak value of the light intensity decreases, the line width of the transfer pattern increases with increasing opening width W because the width of the profile increases.

Region 4 in FIG. 3D has the profile in which the peak of the light intensity is not located at the center position of opening 13, but the peaks are located in the outline portions of the pattern width. In region 4, as can be seen from FIG. 4B, because the sufficiently high light intensity is obtained as a whole, the line width of the transfer pattern increases with increasing opening width W as illustrated in FIG. 4A.

The region 5 in FIG. 3E has the profile in which the peak of the light intensity is located at the center position of opening 13 while the peaks are located in the outline portions of the pattern width. As can be seen from FIG. 4A, region 5 is the state in which the line width of the transfer pattern increases with increasing opening width W.

Regions 4 and 5 have the profiles in which at least two peaks emerge in the light intensity distribution, and region 4 has the even-numbered peaks while region 5 has the odd-numbered peaks. The profiles emerge alternately with increasing opening width W of the photomask. In the profiles of regions 4 and 5, the highest peaks of the light intensity are located in the outline portion of opening 13. However, the highest peak values of the light intensities in regions 4 and 5 are lower than the peak value of the light intensity in region 2.

How the profile of the light intensity distribution changes according to opening width W of the photomask is described above. From these situations, it is found that the states of regions 1 and 2 are not preferable for the formation of the pattern. The generation principle of these situations will be described below.

Figure 5:
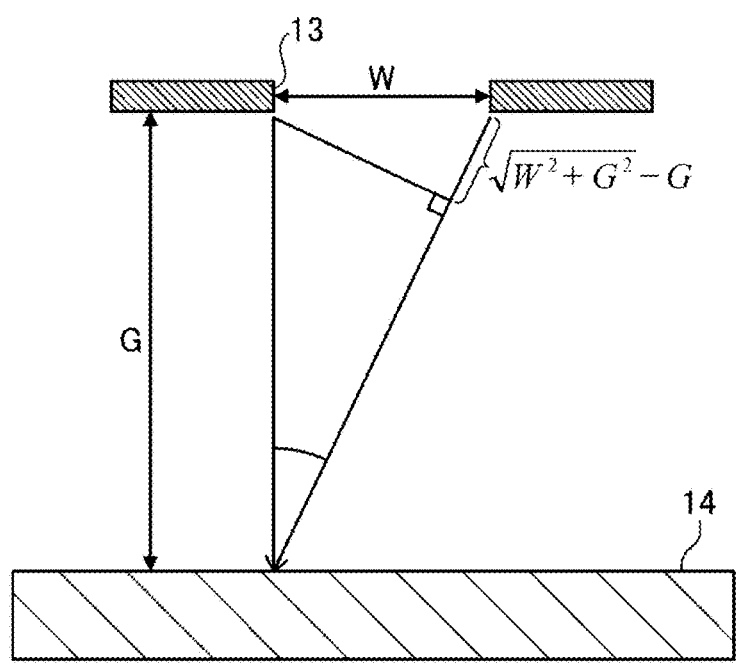
FIG. 5 is a schematic sectional view illustrating an interference phenomenon of light transmitted through an opening.

FIG. 5 schematically illustrates a state of the light transmitted through opening 13 having opening width W. A phenomenon that light beams having phase differences of 360×n° (n is an integer) interfere with each other to increase the light intensity is generated in coherent light. In other words, the light intensity increases in the interference between the light beams in which the optical path difference becomes an integral multiple of wavelength λ of exposure light.

As illustrated in FIG. 5, the maximum optical path difference is expressed by $\sqrt{(W^2+G^2)}-G$ when exposed body 14 separated from opening 13 having opening width W by gap length G is irradiated with the light transmitted through opening 13. Unless the maximum optical path difference is larger than wavelength λ of exposure light, the light intensity of the interference does not exceed the maximum value. Letting wavelength λ of exposure light=365 nm and gap length G=50 μm leads to opening width λ of about 6 μm when the maximum optical path difference is equal to wavelength λ of exposure light.

Therefore, the reason why the light intensity at the center position of opening 13 is maximized at about 6 μm of opening width W in FIGS. 2D and 4B is that a percentage of the light beams transmitted through opening 13 having the optical path difference of each other equal to wavelength λ of exposure light becomes the maximum. The reason why the light intensity at the center position of opening 13 decreases with increasing opening width W is that a percentage of the light having the phase opposite to the light transmitted through main pattern portion 11A, namely, the percentage of the light in which the optical path difference becomes λ×(n+0.5) increases with increasing opening width W. Here, n is an integer. It is found that the phenomenon in which the light intensity increases or decreases with increasing opening width W of opening 13 is generated according to a balance between the percentage of the light beams in which the optical path difference becomes λ×n and the percentage of the light beams in which the optical path difference becomes λ×(n+0.5). When $\sqrt{(W^2+G^2)}-G=\lambda$ is solved using G>>λ, $W \cong \sqrt{(2 \times G \times \lambda)}$ is obtained.

The maximum peak value of the light intensity is generated in opening width W near $W=\sqrt{(2 \times G \times \lambda)}$ in which the percentage of the interference between the light beams having the phases opposite to each other is minimized with respect to the percentage of the interference between the in-phase light beams. When opening width W is larger than $\sqrt{(2 \times G \times \lambda)}$, the peak value of the light intensity does not increase because of the increase in percentage of the interference between the light beams having the phases opposite to each other.

A boundary between regions 2 and 3 in FIG. 4B is the region where the light interference increases. Because the region where the light interference increases emerges according to a pattern layout, it is considered that the distortion is generated in the transfer pattern. The cause to distort the transfer pattern in the mask pattern having the simple square shape will be described below with reference to FIGS. 6A and 6B.

Figure 6A:
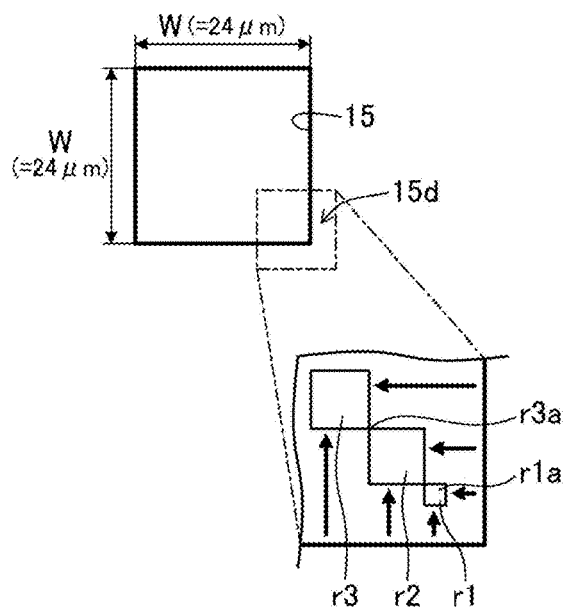
FIG. 6A is a schematic plan view illustrating a cause to deform the transfer image of the proximity exposure method with respect to a mask shape.
Figure 6B:
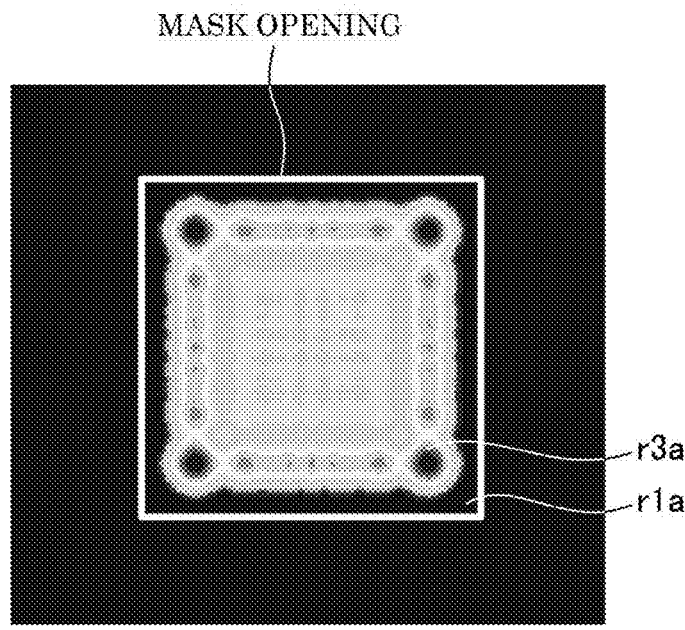
FIG. 6B is a view illustrating a light intensity distribution of the transfer image in the proximity exposure method.

FIG. 6A illustrates the mask layout of the photomask including square opening 15 having one side of 24 μm. FIG. 6B illustrates the light intensity distribution on the exposed body when the exposure is performed at wavelength λ of 365 nm of exposure light with gap length G of 50 μm using the photomask. The light intensity distribution becomes the maximum in convex corner 15d of opening 15. At this point, although relatively high light intensity exists along each side, the relatively high light intensity is lower than the light intensity in each convex corner 15d. In FIG. 6A, the enlarged view of convex corner 15d illustrates the reason the light intensity becomes the maximum in convex corner 15d. Because the two sides of opening 15 intersect each other at convex corner 15d, an interference distance between the light beams in the two direction increases with distance from a vertex of convex corner 15d. Therefore, the same phenomenon as one in which opening width W increases is generated with distance from the vertex of convex corner 15d. The places corresponding to regions 1 to 3 in FIG. 4B that emerge according to the size of opening width W emerge near convex corner 15d in the enlarged view of FIG. 6A. In convex corner 15d of the enlarged view of FIG. 6A, the light intensity is maximized in the place corresponding to a boundary between region 2 designated by numeral r2 and region 3 designated by numeral r3. This is also clear from the light intensity distribution in FIG. 6B. Numerals r3a and r1a in FIG. 6B correspond to numerals r3a and r1a in the enlarged view of the convex corner 15d in FIG. 6A, respectively.

Because the vicinity of each side away from convex corner 11d becomes the state of region 4 or 5 in FIG. 4B, although the light intensity is generated as same as that in the outline portion of opening 15, the light intensity is lower than that in convex corner 15d.

As described above, the excessively strong, undesirable light intensity is generated in the restricted region, namely at the boundary between regions 2 and 3. Conventionally, by adding the auxiliary pattern canceling the excessively strong light intensity, the pattern distortion is eliminated to improve the resolution.

On the other hand, the present inventor found that the pattern distortion is eliminated to improve the resolution by not canceling the strong light intensity generated at the boundary between regions 2 and 3, but adding the auxiliary pattern that can generate the light intensity equal to the strong light intensity in the region where the strong light intensity is not generated.

The principle of the method for enhancing the light intensity in the outline portion of the mask pattern using the auxiliary pattern found by the present inventor will be described below with reference to FIG. 7. As described above with reference to FIGS. 2A to 6B, the phenomenon that the maximum light intensity is yielded in the interference between the light beams transmitted through the plurality of openings of the photomask 12 is generated only in the extremely restricted state. This is because, in most cases, the state in which the light beams having the identical phase interfere with each other and the state in which the light beams having the phases opposite to each other interfere with each other are simultaneously generated in the exposure light.

Figure 7:
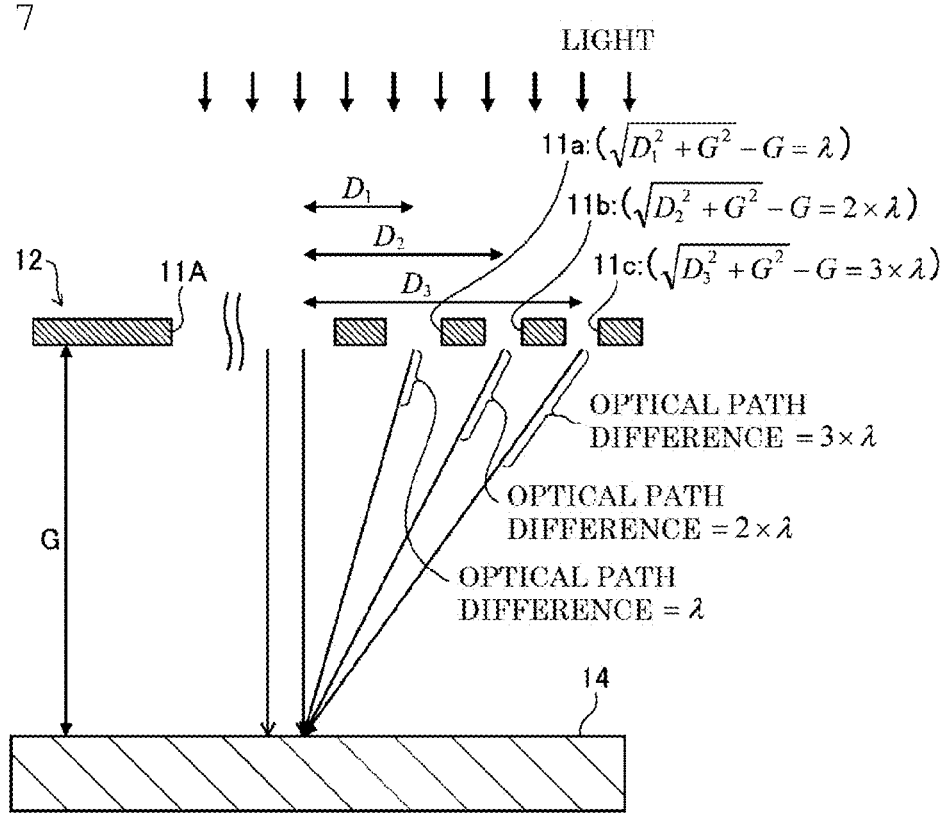
FIG. 7 is a schematic sectional view illustrating conditions that light transmitted through a main pattern portion and light transmitted through an auxiliary pattern are emphasized by interference in the photomask of the first exemplary embodiment.

FIG. 7 schematically illustrates photomask 12 of the first exemplary embodiment, which can solve the situation in which the interference between the light beams having the identical phase and the interference between the light beams having the phases opposite to each other are simultaneously generated, and a propagation state of the transmitted exposure light.

As illustrated in FIG. 7, the opening constituting main pattern portion 11A and the opening constituting auxiliary patterns 11a to 11c, through which the light having the phase identical to that of the light transmitted through the outline portion of the opening is transmitted, are provided in photomask 12 of the first exemplary embodiment. Specifically, auxiliary patterns 11a to 11c constituting the plurality of openings are provided in the region around the outline portion of main pattern portion 11A, and first auxiliary pattern 11a, second auxiliary pattern 11b, and third auxiliary pattern 11c are arranged in the order from the position closer to main pattern portion 11A. At this point, first auxiliary pattern 11a is provided at the position where the optical path difference between the light transmitted through the vicinity in the outline portion of main pattern portion 11A and the light transmitted through first auxiliary pattern 11a is substantially equal to wavelength λ of exposure light. Second auxiliary pattern 11b is provided at the position where the optical path difference between the light transmitted through the vicinity in the outline portion of main pattern portion 11A and the light transmitted through second auxiliary pattern 11b becomes double wavelength λ of exposure light. Third auxiliary pattern 11c is provided at the position where the optical path difference between the light transmitted through the vicinity in the outline portion of main pattern portion 11A and the light transmitted through third auxiliary pattern 11c becomes triple wavelength λ of exposure light. Therefore, the light intensity in the outline portion of main pattern portion 11A can be enhanced higher than the maximum value obtained by the internal interference.

More specifically, referring to FIG. 7, the opening constituting first auxiliary pattern 11a is provided at a distance of D1 from a predetermined position in the vicinity of the outline portion of main pattern portion 11A. At this point, first auxiliary pattern 11a is provided at the position separated from the predetermined position by $\sqrt{(D1^2+G^2)}-G=\lambda$ such that the light intensity is intensified by the interference between the light transmitted through the opening and the light transmitted through main pattern portion 11A at the predetermined position near the outline portion of main pattern portion 11A. As used herein, the predetermined position near the outline portion of main pattern portion 11A means a position near not the end portion of the opening of main pattern portion 11A but the inside of the opening, and the position where the light intensity is intensified by the interference between the light beams transmitted through main pattern portion 11A. This value becomes the position within $\sqrt{(2 \times G \times \lambda)}$ from the outline portion of main pattern portion 11A. By letting G>>λ, D1 is approximately expressed by $D1=\sqrt{(2 \times G \times \lambda)}$ from $\sqrt{(D1^2+G^2)}-G=\lambda$.

Accordingly, under the above condition, first auxiliary pattern 11a may be provided at the position within $\sqrt{(2 \times G \times \lambda)}$ from at least the outline portion of main pattern portion 11A. At this point, the center position of the opening of first auxiliary pattern 11a exists in the region where first auxiliary pattern 11a is provided at the position within $\sqrt{(2 \times G \times \lambda)}$ from the outline portion of main pattern portion 11A. When first auxiliary pattern 11a has a linear planar shape, the center line in the extending direction of first auxiliary pattern 11a exists in the region. In order that the light beams transmitted through first auxiliary pattern 11a interfere sufficiently with each other in the outline portion of desired pattern 1, the opening size of first auxiliary pattern 11a may be larger than wavelength λ of exposure light, or be at least double wavelength λ of exposure light. Similarly, second auxiliary pattern 11b may be provided at the position within $\sqrt{(2 \times G \times 2 \times \lambda)}$ from at least the outline portion of main pattern portion 11A. Third auxiliary pattern 11c may be provided at the position within $\sqrt{(2 \times G \times 3 \times \lambda)}$ from at least the outline portion of main pattern portion 11A. In the general expression, when an n-th auxiliary pattern that is provided at an n-th position with distance from main pattern portion 11A is viewed from the side constituting the outline portion of main pattern portion 11A, the n-th auxiliary pattern may be provided at the position within $\sqrt{(2 \times G \times n \times \lambda)}$ from the end portion in the outline portion. Here, n is a positive integer. The approximation is calculated under the condition of G>>λ when the positions of auxiliary patterns 11a to 11c are calculated from main pattern portion 11A.

When the positions of auxiliary patterns 11a to 11c are expressed by specific numerical values, D1≅6.1 μm, D2≅8.6 μm, and D3≅10.5 μm are obtained at wavelength λ of 365 nm of exposure light with gap length G of 50 μm from the exposed body.

Figure 8A:
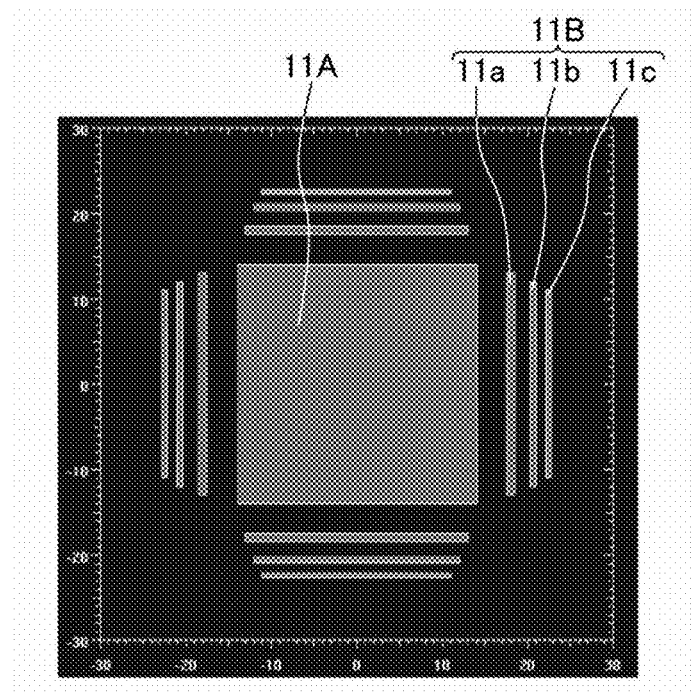
FIG. 8A is a plan view illustrating an example of the photomask of the first exemplary embodiment.
Figure 8B:
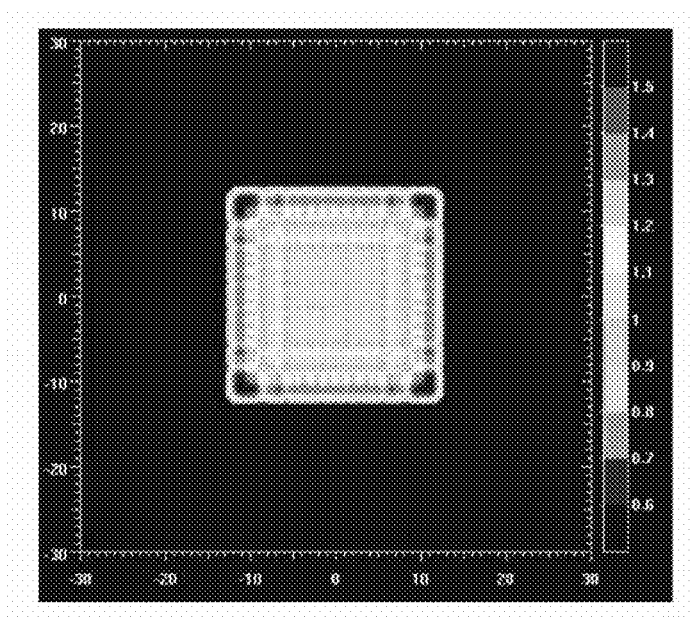
FIG. 8B is a view illustrating a simulation result when the photomask of the first exemplary embodiment is exposed.

FIGS. 8A and 8B illustrate simulation results in the mask pattern produced based on the numerical values. FIG. 8A illustrates the mask pattern. It is assumed that the desired pattern has the square shape having one side of 24 μm like opening 15 of the normal photomask in FIG. 6A. In order to use the internal interference generated in the opening constituting main pattern portion 11A from the viewpoint of mask design, the light collecting position is provided near the inside of the opening. Because the desired pattern has the square shape having one side of 24 μm, each edge of the opening is enlarged by 2 μm to form the square opening having one side of 28 μm such that the light is collected to the desired pattern. First auxiliary pattern 11a, second auxiliary pattern 11b, and third auxiliary pattern 11c, which constitute auxiliary pattern portion 11B, are provided such that the center lines of auxiliary patterns 11a to 11c are located at the positions of D1≅4.1 μm, D2≅6.6 μm, and D3≅8.5 μm from the opening constituting main pattern portion 11A to collect the light to the inside position of 2 μm from the opening. That is, auxiliary patterns 11a to 11c are provided at the position where the enlargement of 2 μm of the opening constituting main pattern portion 11A is converted. First auxiliary pattern 11a, second auxiliary pattern 11b, and third auxiliary pattern 11c have the line widths of 1.0 μm, 0.7 μm, and 0.5 μm, respectively. FIG. 8B illustrates a result in which the light intensity distribution formed in the exposed body 14 is calculated at wavelength λ of 365 nm of exposure light with gap length G of 50 μm using the mask pattern in FIG. 8A. As can be seen from FIG. 8B, the light is collected into the outline portion of the desired pattern compared with the light intensity distribution of the normal photomask in FIG. 6B. Accordingly, it is found that while the outline portion of the desired pattern is formed in high contrast, and the outline portion is formed as the image having the shape close to the desired shape with little distortion.

In order to obtain the desired pattern, some characteristic configurations are provided in auxiliary pattern portion 11B of mask pattern in FIG. 8A. In the normal photomask of FIG. 6B in which auxiliary pattern portion 11B is not provided, the light intensity increases excessively to generate the distortion of the pattern in the convex corner of the opening. Accordingly, preferably auxiliary pattern portion 11B provided in the surrounding of the outline portion of the desired pattern has the configuration in which the light is collected to a region other than the surrounding of the outline portion to obtain the desired shape. In the first exemplary embodiment, auxiliary patterns 11a to 11c are not provided near the convex corner. Therefore, the light is collected to the region other than the convex corner. That is, linear auxiliary patterns 11a to 11c that are arranged in substantially parallel to the side constituting main pattern portion 11A or the convex corner of the desired pattern are shorter than the side of main pattern portion 11A facing auxiliary patterns 11a to 11c. In other words, auxiliary pattern portion 11B is not provided near the convex corner. In the configuration of the photomask of the first exemplary embodiment, the light is collected to the vicinity of each side constituting the outline portion of main pattern portion 11A, but the light is not collected in the convex corner in which the light intensity already increases due to the internal interference.

In the mask pattern of FIG. 8A, auxiliary patterns 11a to 11c are not provided near the convex corner. Alternatively, auxiliary patterns 11a to 11c are not necessarily removed from the vicinity of the convex corner. That is, the light intensity of the light collected into the convex corner by auxiliary pattern portion 11B may be lower than that of the light collected in other regions. For example, a number of auxiliary patterns 11a to 11c may be decreased as auxiliary patterns 11a to 11c approach the convex corner. Specifically, in the example of FIG. 8A, second auxiliary pattern 11b in the extending direction is shorter than first auxiliary pattern 11a, and third auxiliary pattern 11c is shorter than second auxiliary pattern 11b. Therefore, the light intensity of the light collected into the convex corner is weakened compared with other regions. In order to weaken the light collecting effect, it is necessary to decrease the opening widths of auxiliary patterns 11a to 11c as auxiliary patterns 11a to 11c approach the convex corner. When the opening widths of auxiliary patterns 11a to 11c are decreased, the light that is transmitted through auxiliary pattern portion 11B to contribute to the interference is decreased to weaken the light collecting effect in the convex corner.

In the above description, the convex corner is provided in main pattern portion 11A. Actually the above configuration is effective in forming the convex corner in the desired pattern (design pattern). The convex corner means the vertex in which an interior angle formed between the sides constituting the vertex is less than 180° in the case that the outline portion has the linear shape. In the case that the convex portion is constructed with a curve, the size of the curvature radius of the convex portion is less than or equal to a half value of $\sqrt{(\lambda \times G)}$.

The concept (technical thought) that obtains the good pattern by providing auxiliary patterns 11a to 11c collecting the light into the outline portion of the desired pattern is described above. A method for implementing the concept by a combination with the principle in the projection exposure method will be described below with reference to FIGS. 9A and 9B.

Figure 9A:
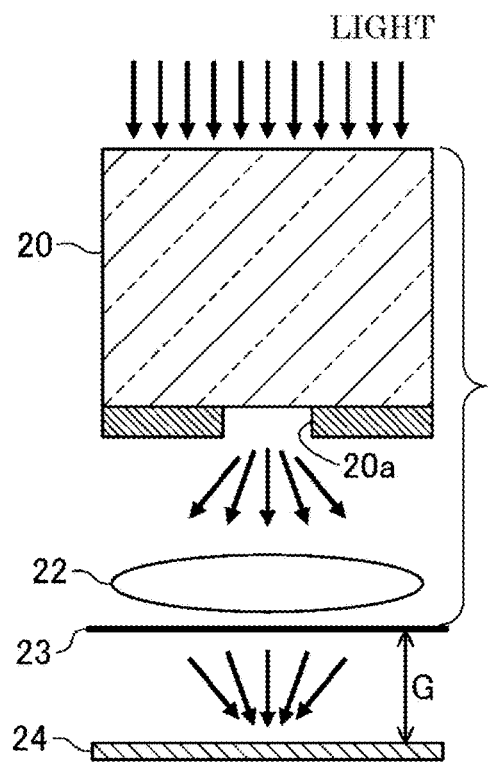
FIG. 9A is a schematic sectional view illustrating a conventional projection exposure method.

FIG. 9A schematically illustrates a structure (principle) of the projection exposure method. Similarly to the proximity exposure method, the light incident from a glass surface (surface) of photomask 20 is expanded by the diffraction when transmitted through opening 20a of photomask 20. Because lens 22 is provided between photomask 20 and exposed body 24, the light expanded by the diffraction forms the image on a projection surface separated from lens 22 by a predetermined distance. That is, the intensity distribution of the light transmitted through opening 20a of photomask 20 is reconstructed on an image forming plane by lens 22. Because the light that can hardly be transmitted through lens 22 due to a large diffraction angle and an evanescent wave do not contribute to the image formation, the resolution is comparable to a degree of the wavelength of exposure light. However, when exposed body 24 is provided in the image forming plane, the extremely high resolution is obtained because the degradation caused by the diffraction can significantly be decreased. In the proximity exposure method, the resolution degrades according to the gap length G, and the size that is about ten times wavelength $\lambda$ is hardly resolved with gap length G of about 50 μm. When compared with the proximity exposure method, the resolution is extremely high in the projection exposure method having the resolution to a degree of the wavelength. Accordingly, the projection exposure method can be dealt with as the method for being able to sufficiently make the desired pattern.

It is assumed that the light is transmitted through propagation plane 23, which is located between lens 22 and the image forming plane on exposed body 24 and separated from exposed body 24 by predetermined gap length G onto the side of lens 22. The light is a wave, and has an amplitude distribution and a phase distribution. In propagation plane 23, it is assumed that, irrespective of the passage of the light, the light having the identical amplitude distribution and phase distribution forms the image having the identical intensity distribution on the identical image forming plane until the light reaches propagation plane 23. Based on this principle, the present inventor found that the image substantially identical to that of the projection exposure method can be formed at the position separated from mask surface 23A by the predetermined gap length G by directly providing the intensity distribution and phase distribution, which are identical to those on propagation plane 23, to the light transmitted through photomask 20A as illustrated in FIG. 9B.

Figure 9B:
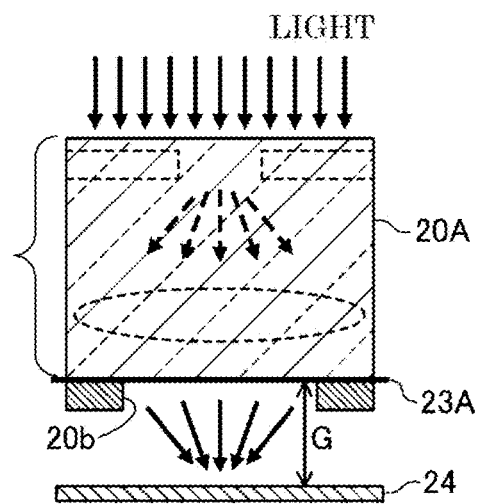
FIG. 9B is a schematic sectional view illustrating a principle of providing an effect equivalent to the projection exposure method adopting the proximity exposure method of the first exemplary embodiment.

FIG. 9B schematically illustrates a concept in the proximity exposure method. Although opening 20a and lens 22, which are identical to those of photomask 20 in FIG. 9A, do not actually exist in photomask 20A, the opening of mask surface 23A is largely expanded, and a phase shifter is provided in opening 20b of photomask 20A. The phase shifter has a transmittance and a phase shift function, which reproduce the amplitude distribution and phase distribution of the light on propagation plane 23 in FIG. 9A when the light is transmitted through the expanded opening. When the phase shifter in FIG. 9B is provided, the image substantially identical to the projection image transferred to exposed body 24 by the projection exposure method in FIG. 9A can also be formed on exposed body 24 by the proximity exposure method.

Figure 10A:
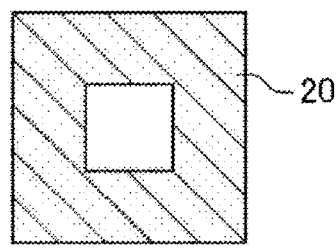
FIG. 10A is a schematic plan view illustrating a projection exposure photomask.
Figure 10B:
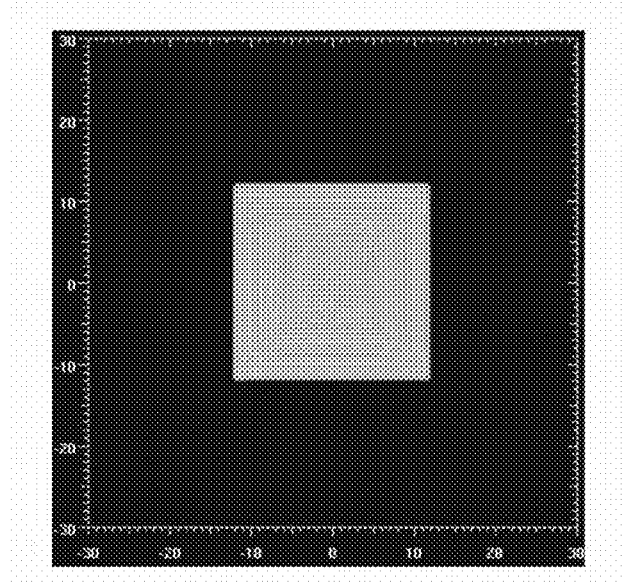
FIG. 10B is a view illustrating a light intensity distribution of a simulation result of the transfer image by the projection exposure method.

The amplitude distribution and phase distribution of the light on propagation plane 23 will be described with reference to FIGS. 10A to 10D. FIG. 10A illustrates a planar configuration of photomask 20 for the projection exposure, and photomask 20 includes the square opening pattern in which one side has the width of 24 μm. The case that the exposure is performed using photomask 20 will be described below as an example. At this point, wavelength λ of exposure light is set to 365 nm. FIG. 10B illustrates the light intensity distribution of the simulation result of the transfer image obtained by the projection exposure method. Because the resolution is obtained to a degree of the size of wavelength λ of exposure light by the projection exposure method, the transfer image having the shape extremely close to the mask pattern in photomask 20 is obtained in sufficient contrast.

Figure 10C:
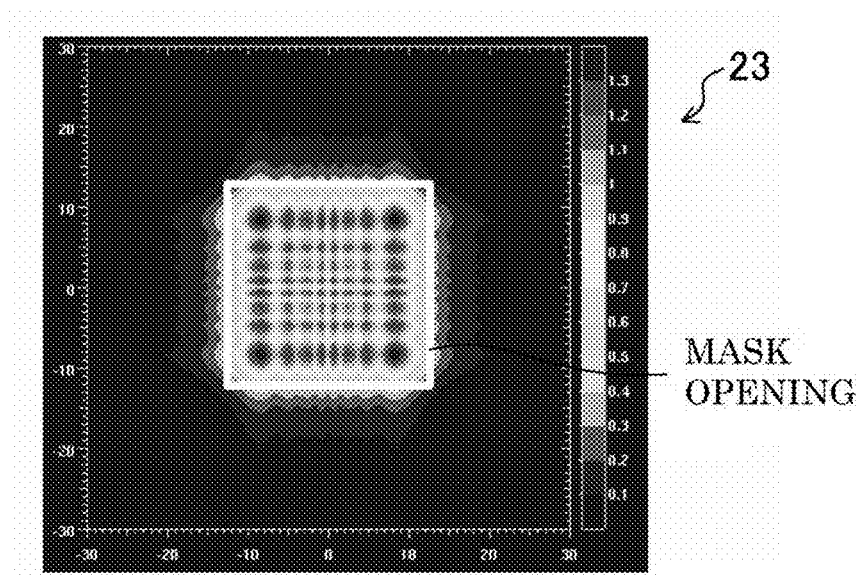
FIG. 10C is a view illustrating an amplitude distribution on a light propagation plane.
Figure 10D:
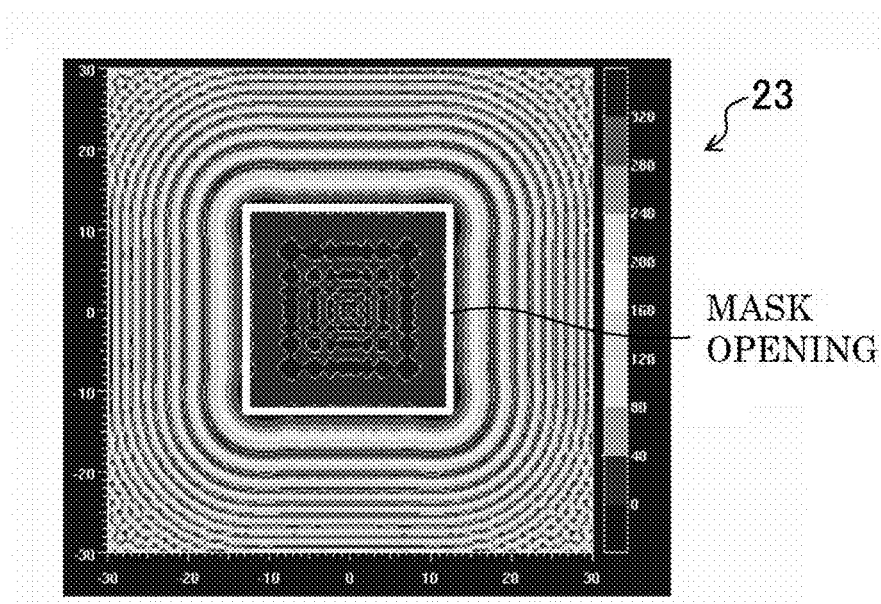
FIG. 10D is a view illustrating a phase distribution on the light propagation plane.

FIGS. 10C and 10D illustrate the amplitude distribution and phase distribution of the light on propagation plane 23, respectively. Propagation plane 23 is located between lens 22 and exposed body 24 in FIG. 9A, and separated from exposed body 24 by 50 μm.

At this point, the phase distribution circulates at 360°, and thus the identical phase plane emerges at 0° and 360°. Accordingly, as can be seen from FIG. 10D, the phase distribution becomes the phase close to 0° and 360° at the position corresponding to the vicinity inside the opening. That is, it is found that the phase plane of the light is parallel to the mask surface, and that the phase plane travels in the direction substantially perpendicular to photomask 20. At the position corresponding to the surrounding of the outline portion of the opening, the phase changes with distance from the opening, and the light converges into the shape of the desired pattern at a time point the light reaches exposed body 24. Therefore, it is found that the phase plane around the opening is inclined toward the inside of the opening. In other words, based on the principle of the projection exposure method, the phases of all the light beams reaching the image forming plane have the identical value on the image forming plane, namely, the surface on which the image having the highest contrast is formed. It can be read from the phase distribution which light transmitted with a phase at a position in the outer periphery of the desired pattern interferes with the light transmitted through the desired pattern to enhance the light intensity.

On the other hand, as illustrated in FIG. 10C, the amplitude distribution is weakened from the region located near the inside of the opening of photomask 20, and expanded at the position corresponding to the outer periphery of the opening. In consideration of the combination with the phase distribution, the light around the opening is collected to the vicinity of the outline portion of the opening to form the transfer image in propagation plane 23.

Accordingly, in the case that the opening constituting the main pattern is provided in the region corresponding to the desired pattern, and in the case that the plurality of auxiliary patterns are provided such that the light intensity of the light transmitted through the opening constituting the main pattern is enhanced by the interference in the outline portion of the desired pattern, the plurality of auxiliary patterns may be provided in the region expanded to the surrounding of the opening constituting the main pattern based on the amplitude distribution, and the phase of the light transmitted through each auxiliary pattern may be set based on the phase distribution.

The amplitude distribution and phase distribution in FIGS. 10C and 10D will be described in detail with reference to FIGS. 11A and 11B. An example of a preferable region where the auxiliary pattern that has the phase of 0°, namely includes the simple opening having the simple shape is added to each of the distribution diagrams in FIGS. 11A and 11B. Specifically, in the amplitude distribution of FIG. 11A, the preferable region where the auxiliary pattern is provided is the region that is located around the desired pattern and in which the amplitude is greater than or equal to a predetermined value. On the other hand, in the phase distribution of FIG. 11B, the preferable region where the auxiliary pattern is provided is the region having the phase of 0° when the auxiliary pattern has the simple opening. Assuming that the auxiliary pattern is the pattern constructed with the phase shifter having the opposite phase of 180°, the phase region of 180°becomes the preferable region as the auxiliary pattern. The same holds true for the phase shifter having any phase. From the phase distribution in FIG. 11B, it is found that the proper phase region is selected as the phase shifter having each phase.

Thus, the auxiliary pattern condition suitable for the formation of the transfer image that emphasizes the outline portion of the desired pattern can be read by the amplitude distribution and the phase distribution. The detailed auxiliary pattern condition will be described below.

Figure 11A:
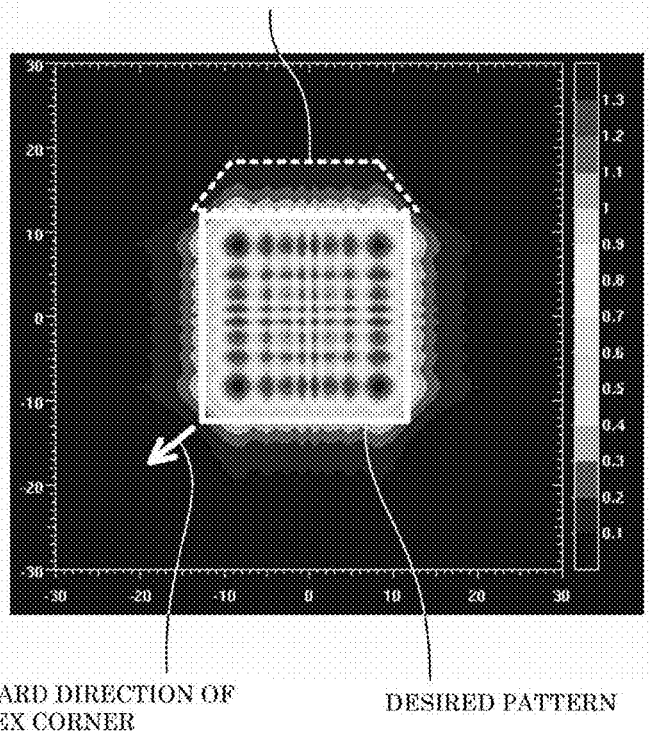
FIG. 11A is a view illustrating the amplitude distribution on the light propagation plane for explaining a principle of preparing the auxiliary pattern of the photomask of the first exemplary embodiment.
Figure 11B:
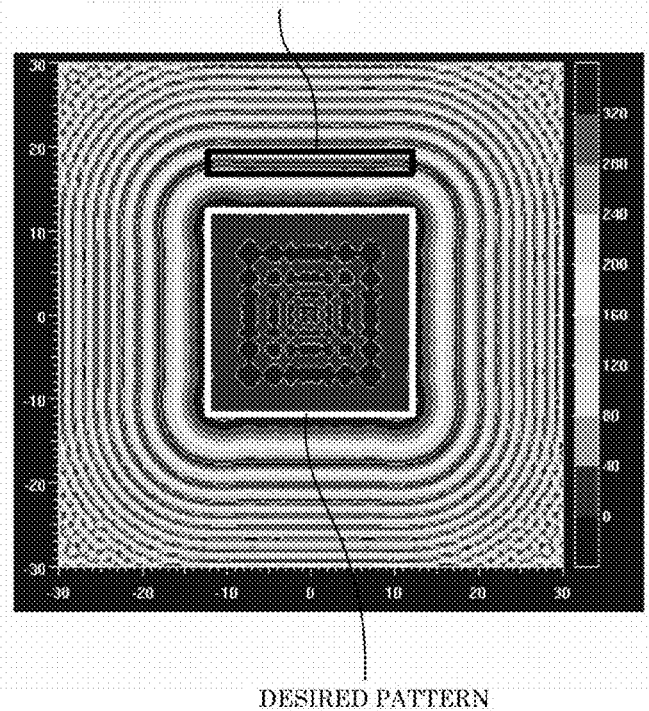
FIG. 11B is a view illustrating the phase distribution on the light propagation plane for explaining a principle of preparing the auxiliary pattern of the photomask of the first exemplary embodiment.

When attention is paid to the phase distribution in FIG. 11B, the region having the phase of about 0° is larger than the desired pattern region by about 2 μm at the position corresponding to the pattern region. It is found that preferably the main pattern portion is enlarged by about 2 μm compared with the desired pattern. This is because the main pattern portion of the mask pattern in FIG. 8A is enlarged compared with the desired pattern. At this point, it is not preferable that an enlargement amount of the side in the outline portion constituting the main pattern portion is larger than a half of $\sqrt{(2 \times G \times \lambda)}$, and it is preferable that the enlargement amount is suppressed less than or equal to two thirds of $\sqrt{(2 \times G \times \lambda)}$. In the phase distribution, preferably the phases are matched with each other in the outline portion of the desired pattern. Therefore, when the side of the main pattern portion is enlarged greater than or equal to a half of $\sqrt{(2 \times G \times \lambda)}$, the light having the opposite phase in the outline portion of the desired pattern is passed through the main pattern portion. In contrast, preferably the enlargement amount increases largely in the main pattern portion in order that the in-phase light beams interfere sufficiently with each other in the outline portion of the desired pattern. For example, the enlargement amount may be greater than or equal to one eighth of $\sqrt{(2 \times G \times \lambda)}$ or one fourth of $\sqrt{(2 \times G \times \lambda)}$.

For the phase distribution in the outline portion of the desired pattern, the position farthest from the desired pattern is the position the position separated from the desired pattern by about $\sqrt{(2 \times G \times \lambda)}$. At the position farthest from the desired pattern, the phase is substantially identical to that inside the desired pattern, and the phase difference becomes 0°. Generally, an n-th position that emerges in the direction separated from the desired pattern with the phase difference of 0° is the position separated from the desired pattern by about $\sqrt{(2 \times G \times n \times \lambda)}$. This can be obtained from the condition that the optical path difference in the outline portion of the desired pattern is matched with an integral multiple of the wavelength of exposure light. Accordingly, the auxiliary pattern including the simple opening, namely, the opening in which phase difference with the phase identical to that of the main pattern portion becomes 0° may be provided at the position separated from the desired pattern by $\sqrt{(2 \times G \times n \times \lambda)}$. Here, n is a positive integer.

As described above, the main pattern portion may be formed into a planar shape including the new outline portion in which the outline portion of the desired pattern is enlarged. When the position where the auxiliary pattern is provided is expressed by the position separated from the outline portion of the main pattern portion, the n-th auxiliary pattern provided in the direction separating from the main pattern portion to the surrounding may be provided at the position within $\sqrt{(2 \times G \times n \times \lambda)}$ from the outline portion of the main pattern portion. The nth auxiliary pattern provided at the position within √(2×G×n×λ) means that the whole auxiliary pattern is not included in the position within √(2×G×n×λ) from the outline portion of the main pattern portion, but the center line in the extending direction of the auxiliary pattern is included in the region when the auxiliary pattern is formed into the linear shape. When the auxiliary pattern is formed into an isolated island shape, the central portion of the auxiliary pattern is included in the region.

For example, in the case that the three auxiliary patterns are arranged, the auxiliary patterns are most efficiently provided at the positions of √(2×G×1×λ), √(2×G×2×λ), and √(2×G×3×λ) from the outline portion of the desired pattern. In the case that the auxiliary patterns are provided at the proper positions like √(2×G×1×λ), √(2×G×3×λ), and √(2×G×4×λ), the three auxiliary patterns are not necessarily arranged at the positions expressed by √(2×G×n×λ) in the ascending order. The plurality of auxiliary patterns do not influence one another, but all the plurality of auxiliary patterns influence the desired pattern so as to emphasize the light intensity of the outline portion of the desired pattern and to overlap one another. Although the more number of auxiliary patterns is better, even if the auxiliary patterns are partially lacked, the effect of the lacked auxiliary pattern is simply decreased. In the region between the auxiliary patterns, light blocking parts of the light blocking member may be provided between the auxiliary pattern portion and the main pattern portion, and between the auxiliary patterns, such that the opposite-phase light, which cancels the light in the main pattern portion by the interference, is not mixed in the outline portion of the desired pattern. As described above, the width size of the auxiliary pattern is larger than the wavelength of exposure light. Similarly, in order to sufficiently remove the light having the undesirable phase, the width of the light blocking part may be larger than the wavelength of exposure light, and greater than or equal to double the wavelength of exposure light.

The interval between the position of the first auxiliary pattern and the position of the second auxiliary pattern is comparable to (√(2×G×2×λ)−√(2×G×λ)). When the interval becomes a sum of the width of the auxiliary pattern and the width of the light blocking part, the width size may be greater than or equal to double wavelength λ of exposure light, or four times wavelength λ of exposure light in the case that the two auxiliary patterns are provided between the auxiliary patterns. For example, in the first exemplary embodiment, gap length G larger than at least 4.3 μm may be used in the exposure at wavelength λ of 365 nm of exposure light, and gap length G may be greater than or equal to 17.2 μm.

When attention is paid to the amplitude distribution in FIG. 11A, the amplitude distribution is expanded in the direction perpendicular to each side of the desired pattern, and the intensity decreases with distance from each side. Therefore, it is found that the amplitude distribution is expanded into a trapezoidal shape when viewed from each side. As illustrated in FIG. 11A, the amplitude distribution is not expanded in the outward direction of each convex corner. Because the auxiliary pattern preferably reproduces the amplitude distribution, the opening width of the region having the larger light intensity may be increased to transmit the more light in the amplitude distribution. On the other hand, in the amplitude distribution, the opening width of the region having the smaller light intensity may be decreased or the opening may not be provided. Accordingly, the auxiliary pattern is provided in substantially parallel to each side of the desired pattern, and the opening width of the auxiliary pattern provided at the position farther away from the desired pattern may be decreased smaller than that of the auxiliary pattern provided at the position closer to the desired pattern.

In the above description, the linear pattern is presumed as the planar shape of the auxiliary pattern. As long as the auxiliary pattern has the isolated island shape, the opening area of the auxiliary pattern provided at the position farther away from the desired pattern may be smaller than that of the auxiliary pattern provided at the position closer to the desired pattern. When the auxiliary pattern provided in substantially parallel to each side of the desired pattern is formed into the linear shape, the auxiliary pattern provided at the position farther away from the desired pattern may be shorter than the auxiliary pattern provided at the position closer to the desired pattern. In the case that the plurality of auxiliary patterns are pattern provided in substantially parallel to each side of the desired pattern, the plurality of auxiliary patterns may be formed such that the number of auxiliary patterns decreases as the auxiliary patterns come close to the vicinity of the convex corner, namely, such that the pattern is eliminated in midstream. This is the configuration in which the amplitude distribution is weakened on the extended line of the vertex of the convex corner. The similar effect can be obtained by decreasing the opening width of each auxiliary pattern in the vicinity of the convex corner in addition to the removal of the auxiliary pattern and the decrease of the number of auxiliary patterns.

Figure 12A:
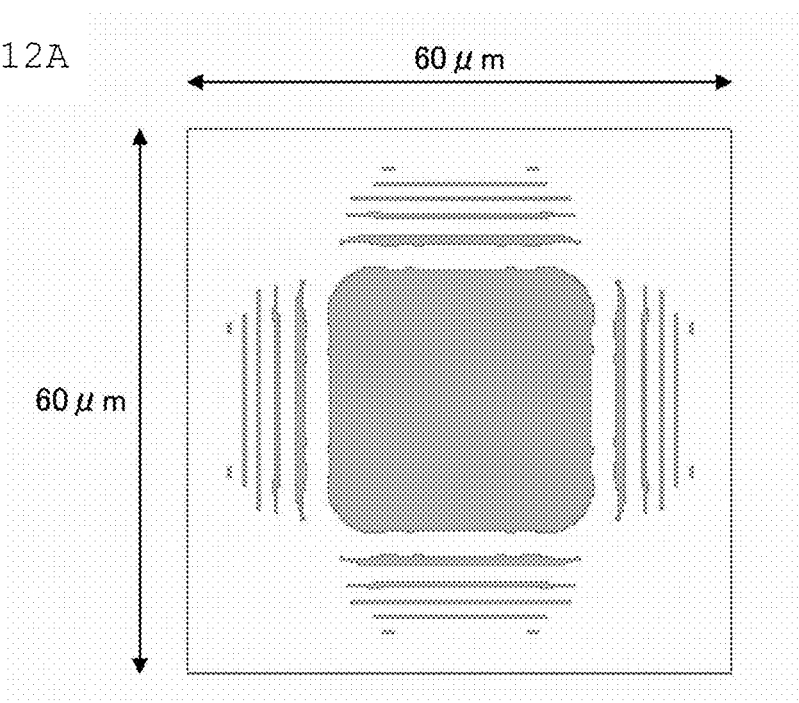
FIG. 12A is a plan view illustrating an example in which a mask pattern is prepared based on the principle of preparing the auxiliary pattern of the photomask of the first exemplary embodiment.
Figure 12B:
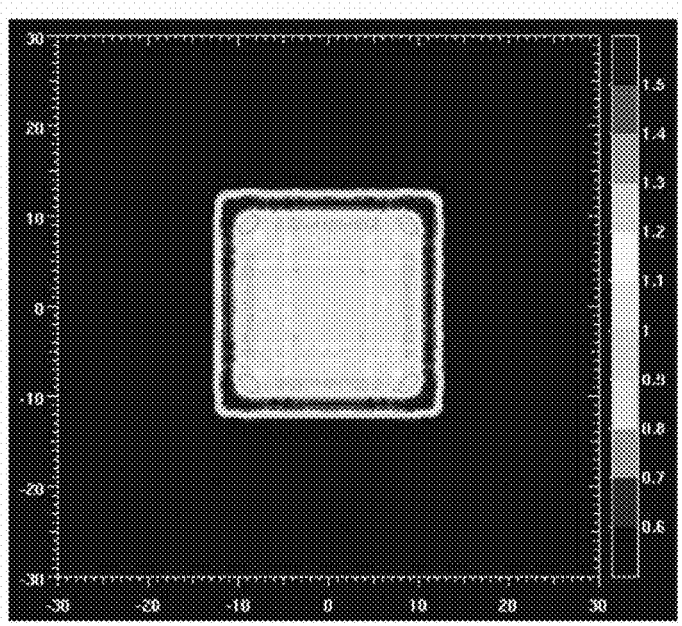
FIG. 12B is a view illustrating a simulation result when the photomask in FIG. 12A is exposed.

The preferable configuration is described above as the auxiliary pattern. The actual result of the mask pattern directly calculated from the amplitude distribution and phase distribution in FIGS. 11A and 11B will be described below. In the mask pattern producing method, the region where the phase distribution becomes the vicinity of 0° is extracted as the opening. The auxiliary pattern is calculated such that the opening width of the auxiliary pattern increases in proportion to the intensity of the amplitude distribution on the light propagation plane. As used herein, the vicinity of 0° of the phase distribution means not that the phase distribution has the value extremely close to 0°, but that preferably the light having the opposite phase is not included in the phase distribution. FIG. 12A illustrates a mask drawing calculated by the algorithm. As illustrated in FIG. 12A, it is found that the above configuration is implemented in the main pattern portion and the auxiliary pattern portion. FIG. 12B illustrates a simulation result when the mask drawing is exposed. As to the exposure condition, wavelength λ of exposure light is set to 365 nm and gap length G is set to 50 μm. A collimation angle of the light source is set to 1.5°. In the light intensity distribution transferred to the exposed body, an outline image is formed in high contrast in which the light intensity is increased in the outline portion of the desired pattern. The good shape of the simulation result is obtained with little distortion with respect to the shape of the desired pattern.

As described above, in the first exemplary embodiment, the good shape having little distortion is obtained with respect to the shape of the desired pattern by the proximity exposure method. The present disclosure is effectively applied to not only the simple pattern shape including the fine size that can be hardly formed by the conventional proximity exposure method but also to any pattern shape that is continued by the line widths having different sizes.

First Modification of First Exemplary Embodiment

A first modification is described below with reference to FIGS. 13A to 13C.

Figure 13A:
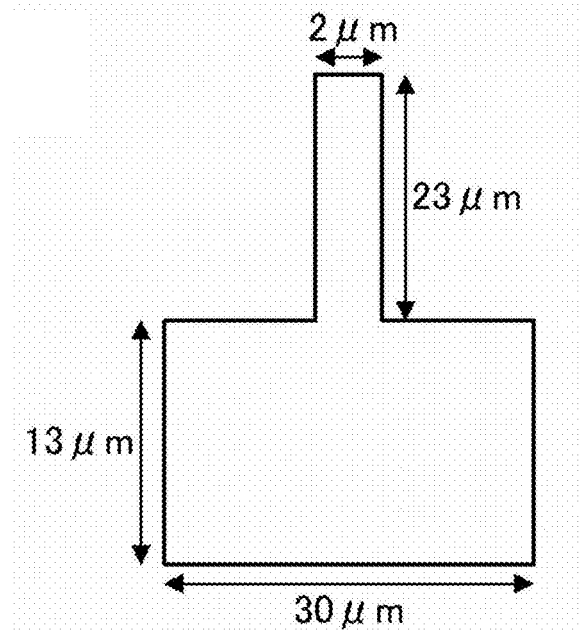
FIG. 13A is a plan view illustrating a desired pattern according to a first modification of the first exemplary embodiment.

FIG. 13A illustrates a desired pattern that includes a linear pattern having the width of 2 μm and a rectangular pattern having a long side of 30 μm and a short side of 13 μm. The linear pattern is continuously connected to the rectangular pattern, so that the line width of the desired pattern varies largely. The linear pattern has the width of 2 µm, which is hardly formed by the proximity exposure method at wavelength λ of 365 nm of exposure light with gap length G of 50 µm. Similarly to FIGS. 11A and 11B, FIG. 13B illustrates the mask drawing of the first modification that is calculated based on the amplitude distribution and phase distribution on the propagation plane generated in exposing the desired pattern by the projection exposure method.

Figure 13B:
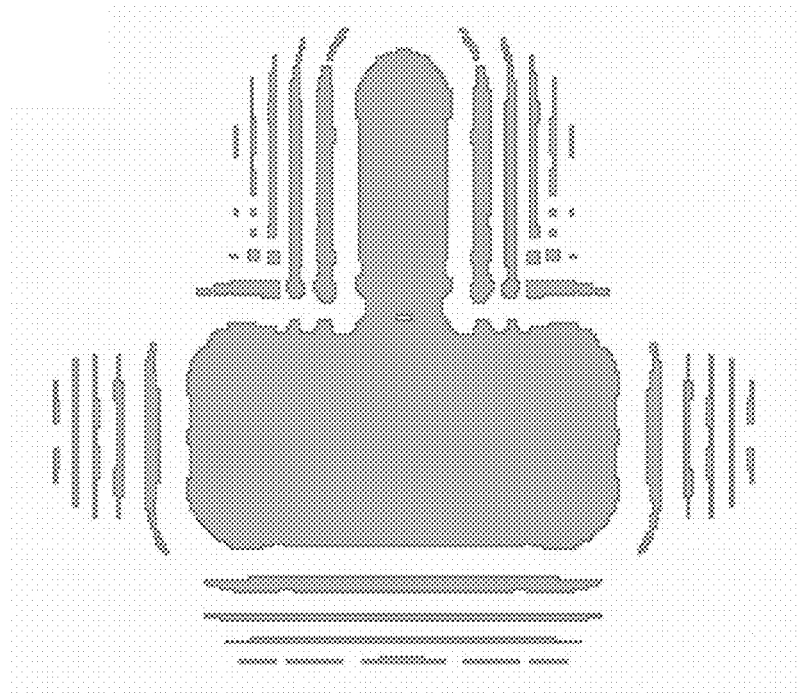
FIG. 13B is a plan view illustrating the photomask of the first modification of the first exemplary embodiment.
Figure 13C:
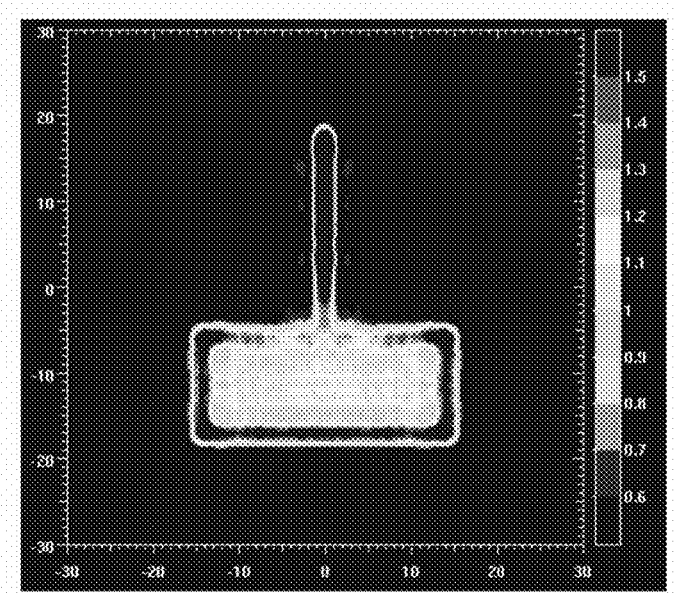
FIG. 13C is a view illustrating a simulation result when the photomask of the first modification of the first exemplary embodiment is used.

The photomask of the first modification in FIG. 13B has the configuration satisfying the present disclosure of the main pattern portion and the auxiliary pattern portion. FIG. 13C illustrates a simulation result when the exposure is performed using the photomask. As to the exposure condition, wavelength λ of exposure light is set to 365 nm and gap length G is set to 50 µm. A collimation angle of the light source is set to 1.5°. From the simulation result in FIG. 13C, the light intensity distribution transferred to the exposed body has a high-contrast outline image that the light intensity is increased in the outline portion of the desired pattern. The high-contrast outline image has a good shape with little distortion with respect to the shape of the desired pattern, and the liner pattern having the width of 2 µm, which is hardly formed by the normal proximity exposure method, is formed in higher contrast than the other patterns. This is attributed to the following fact. The opening width of the auxiliary pattern provided along the liner pattern having the width of 2 µm, which is smaller than $\sqrt{(\lambda \times G)}$ that is of the resolution limit in the proximity exposure method, is larger than the opening width of the auxiliary pattern provided in the rectangular pattern having the width of 30 µm in which a problem of resolution is not generated, in order that the light intensity is increased by the interference with the light transmitted through the auxiliary pattern along the liner pattern.

Figure 13D:
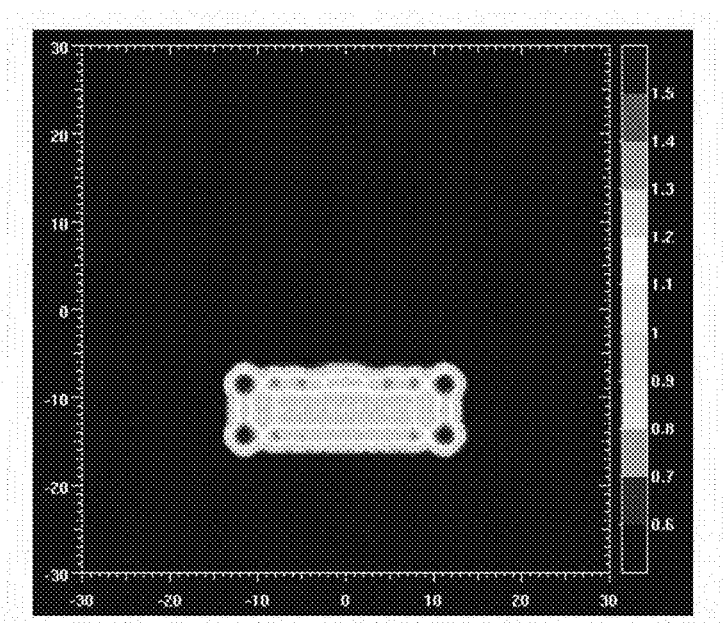
FIG. 13D is a view illustrating a reference example of a simulation result of a photomask that does not include the auxiliary pattern of the photomask of the first modification.

FIG. 13D illustrates a simulation result as a reference example when the desired pattern is used as the mask shape without auxiliary patterns. As is clear from FIG. 13D, the liner pattern having the width of 2 µm is less than or equal to the resolution limit.

As described above, by using the proximity exposure method of the first exemplary embodiment, the good exposure pattern can be formed with respect to the desired pattern having the pattern size smaller than $\sqrt{(\lambda \times G)}$ that is of the conventional resolution limit.

Thus, the auxiliary pattern portion constituting photomask 12 of the first exemplary embodiment may be provided regardless whether or not the desired pattern has the resolution limit size of the conventional proximity exposure method. Particularly, the auxiliary pattern may be provided in the region less than or equal to the size defined by $\sqrt{(\lambda \times G)}$. The auxiliary pattern may be provided only near the pattern having the opening size less than or equal to $\sqrt{(\lambda \times G)}$ if the distortion caused by the pattern having the opening size greater than or equal to $\sqrt{(\lambda \times G)}$ is permitted.

Second Modification of First Exemplary Embodiment

Figure 14:
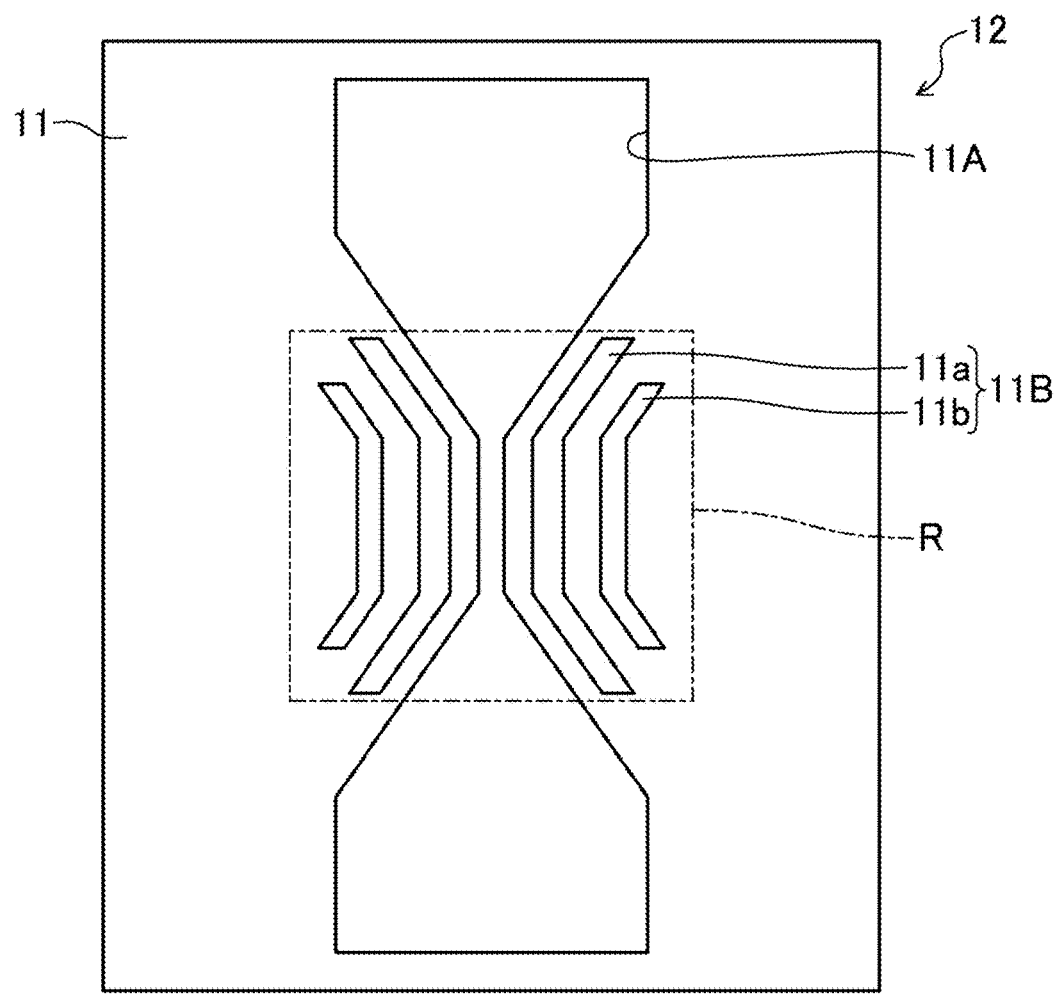
FIG. 14 is a plan view illustrating a photomask according to a second modification of the first exemplary embodiment.

FIG. 14 illustrates an example of the above configuration as a second modification.

As illustrated in FIG. 14, in the second modification, when the exposure is performed at wavelength λ of exposure light with gap length G, the desired pattern includes the region that is less than or equal to the size defined by $\sqrt{(\lambda \times G)}$ and the region where the pattern width is larger than the size defined by $\sqrt{(\lambda \times G)}$. At this point, the auxiliary pattern portion 11B having the configuration of the first exemplary embodiment may be provided in the surrounding of a region R where the size of the desired pattern is less than or equal to $\sqrt{(\lambda \times G)}$.

Specifically, in the second modification, two auxiliary patterns 11a and 11b are provided in the region R. Auxiliary patterns 11a and 11b are provided in the surrounding of the pattern having the opening width defined by $\sqrt{(\lambda \times G)}$ that is hardly formed with the conventional normal mask. Main pattern portion 11A and auxiliary pattern portion 11B include the configuration of the present disclosure.

Second Exemplary Embodiment

A second exemplary embodiment is described below with reference to FIGS. 15A, 15B, 16A, and 16B.

Figure 15A:
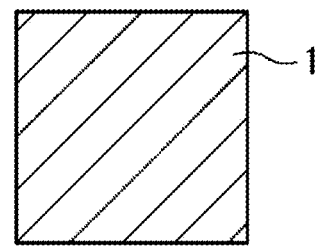
FIG. 15A is a plan view illustrating a desired pattern that is of a forming target of a photomask according to a second exemplary embodiment.
Figure 15B:
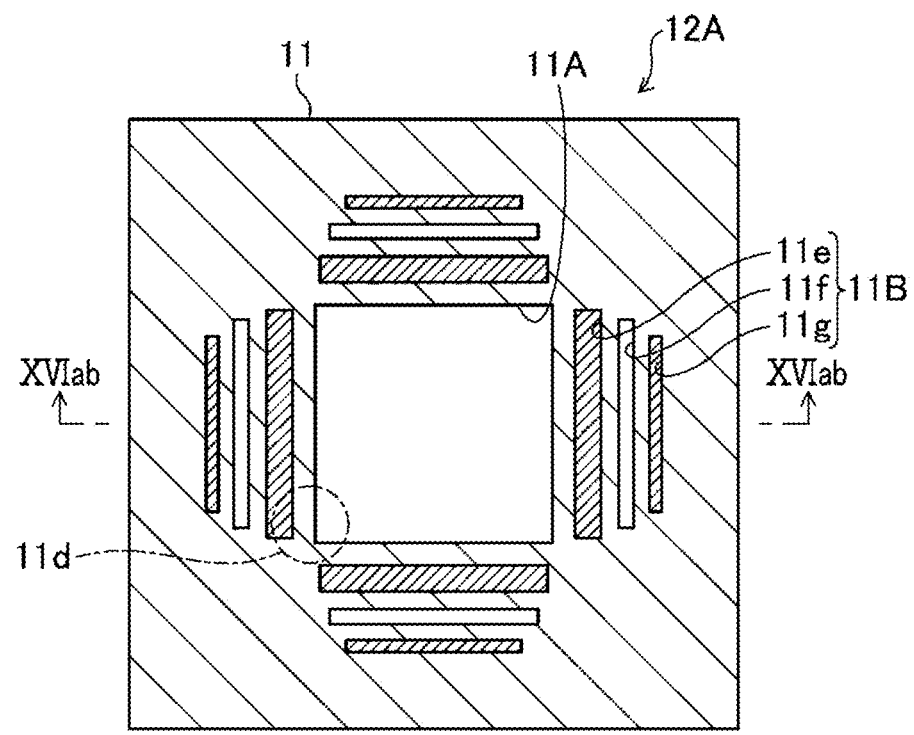
FIG. 15B is a plan view illustrating a rear surface side of the photomask of the second exemplary embodiment.
Figure 16A:
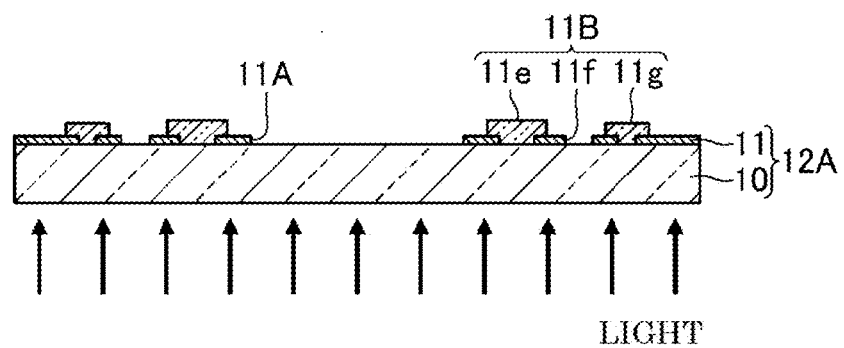
FIG. 16A is a sectional view at a line XVIab-XVIab in FIG. 15B.
Figure 16B:
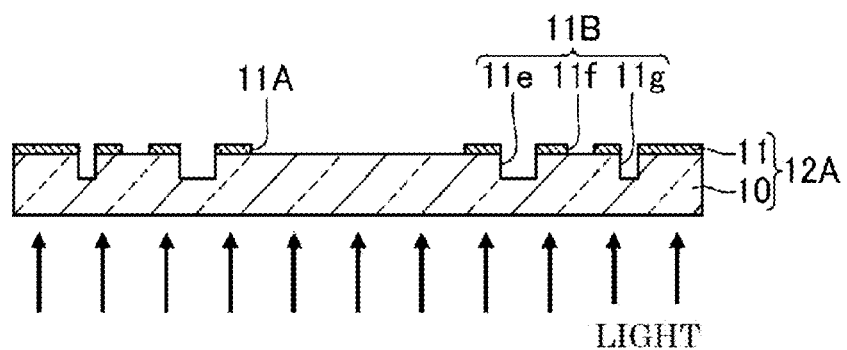
FIG. 16B is a sectional view at a line XVIab-XVIab in FIG. 15B.

FIG. 15A illustrates a planar configuration of a desired pattern of the second exemplary embodiment. FIG. 15B illustrates a layout of a photomask that makes desired pattern 1. FIGS. 16A and 16B are sectional views at a line XVIab-XVIab in FIG. 15B.

In FIGS. 15A to 16B, the component identical to that in FIGS. 1A to 1C is designated by the identical numeral.

In FIG. 15B, photomask 12A of the second exemplary embodiment differs from photomask 12 of the first exemplary embodiment in the following configuration. First auxiliary pattern 11e and third auxiliary pattern 11g, which constitute auxiliary pattern portion 11B, are constructed with a phase shifter transmitting the light having the phase different from that of main pattern portion 11A (different phase). In the second exemplary embodiment, the phase different from the phase of the light transmitted through main pattern portion 11A may be the phase opposite to the phase of the light transmitted through main pattern portion 11A. Similarly to the first exemplary embodiment, second auxiliary pattern 11f includes the opening that transmits the light having the phase identical to that of main pattern portion 11A (in-phase).

First auxiliary pattern 11e, second auxiliary pattern portion 11f, and third auxiliary pattern 11g, which constitute auxiliary pattern portion 11B, are configured such that width sizes of auxiliary patterns 11e to 11g decrease in this order with distance from main pattern portion 11A. In the auxiliary patterns adjacent to each other, the interval between the center lines in each extending direction may be narrowed with distance from main pattern portion 11A. Specifically, the interval between the center lines of second auxiliary pattern 11f and third auxiliary pattern 11g may be smaller than the interval between the center lines of first auxiliary pattern 11e and second auxiliary pattern 11f. Auxiliary pattern portion 11B is not provided in the region where the light intensity increases due to internal interference in the opening of main pattern portion 11A, namely, convex corner 11d in which the exposure light is collected. Similarly to the first exemplary embodiment, the number of auxiliary patterns 11e to 11g may be decreased as auxiliary patterns 11e to 11g comes close to each convex corner 11d, namely, both the end portions of each of auxiliary patterns 11e to 11g may be eliminated. In other words, a distance between an extended line in which each side of main pattern portion 11A is extended and the end portion in the extending direction of second auxiliary pattern 11f may be longer than a distance between the extended line and the end portion in the extending direction of first auxiliary pattern 11e. Additionally, in auxiliary pattern portion 11B, the auxiliary pattern that transmits the in-phase light having the phase identical to that of the light transmitted through main pattern portion 11A (for example, second auxiliary pattern 11f) and the auxiliary pattern that transmits the light having the phase opposite to that of the light transmitted through main pattern portion 11A (for example, first auxiliary pattern 11e or third auxiliary pattern 11g) are preferably adjacent to each other in the direction away from main pattern portion 11A.

In the second exemplary embodiment, by way of example, three auxiliary patterns 11e to 11g are provided as auxiliary pattern portion 11B along the sides constituting the outline portion of main pattern portion 11A. Alternatively, two or four auxiliary patterns may be provided in auxiliary pattern portion 11B. For example, in the case that the four auxiliary patterns are provided, an auxiliary pattern that transmits the light having the phase identical to that of the light transmitted through main pattern portion 11A may be provided in the region outside third auxiliary pattern 11g, which is an example of a phase shifter that transmits the light having the opposite phase in the surrounding of main pattern portion 11A. Similarly to the first exemplary embodiment, each side of main pattern portion 11A and each side of auxiliary patterns 11e to 11g are formed into the linear shape. Alternatively, each side may be formed into the substantially linear shape, and have the small uneven shape that is less than or equal to the resolution limit in the proximity exposure method.

FIG. 16A illustrates an example of a sectional configuration in photomask 12A of the second exemplary embodiment. In the second exemplary embodiment, first auxiliary pattern 11e and third auxiliary pattern 11g, which constitute auxiliary pattern portion 11B, constitute the phase shifter constructed with a phase shift film. Each phase shift film inverses the phase of the light transmitted through the phase shift film by about 180°. The inversion of the light phase by 180°, namely, a shift of the light phase by 180° is equal to the value expressed by 180°±360×n° (n is an integer). Unless otherwise noted, the value of the phase is dealt with as equal value even for the phase difference of 360°.

FIG. 16B illustrates a modification of photomask 12A of the second exemplary embodiment. As illustrated in FIG. 16B, instead of the phase shift film, the phase shifter is constructed with an engraved portion in which translucent substrate 10 is engraved. That is, the phase shifter is constructed by a difference between a refractive index of quartz or glass constituting translucent substrate 10 and a refractive index of air with which the engraved portion is filled.

Figure 17:
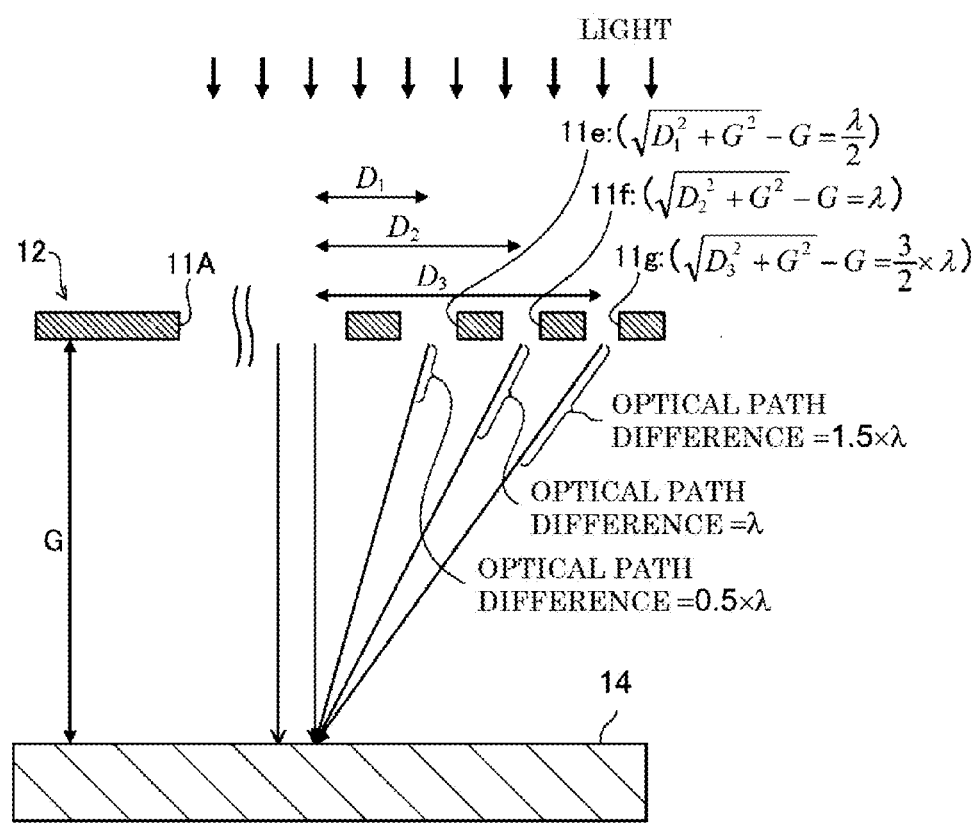
FIG. 17 is a schematic sectional view illustrating conditions that light transmitted through a main pattern portion and light transmitted through an auxiliary pattern are emphasized by interference in the photomask of the second exemplary embodiment.

A principle of obtaining the good pattern by the proximity exposure method using photomask 12A of the second exemplary embodiment illustrated in FIG. 17 is described below. In FIG. 17, similarly to FIG. 7, it is considered the condition satisfying the state in which the light transmitted through main pattern portion 11A and the light transmitted through each of auxiliary patterns 11e to 11g are intensified in the outline portion of the desired pattern by the interference.

In auxiliary patterns 11a to 11c of the first exemplary embodiment, the condition is that the optical path difference between the light transmitted through each auxiliary patterns 11a to 11c, which has the phase identical to that of main pattern portion 11A, and the light transmitted through main pattern portion 11A is n×λ (n is an integer) with respect to wavelength λ of exposure light.

On the other hand, when the light transmitted through one of auxiliary patterns 11e to 11g has the phase opposite to that of the light transmitted through main pattern portion 11A, the optical path difference becomes (n+0.5)×λ (n is an integer) on the condition that these light beams are intensified by the interference. Accordingly, in the second exemplary embodiment, assuming that first auxiliary pattern 11e and third auxiliary pattern 11g transmit the light having the phase opposite to that of main pattern portion 11A while second auxiliary pattern 11f transmits the light having the phase identical to that of main pattern portion 11A, it is necessary that distances D1, D2, and D3 indicating the positions of auxiliary patterns 11e to 11g satisfy the following conditions.

$$\sqrt{(D1^2+G^2)}-G=0.5\times\lambda$$

$$\sqrt{(D2^2+G^2)}-G=1\times\lambda$$

$$\sqrt{(D3^2+G^2)}-G=1.5\times\lambda$$

Under these conditions, first auxiliary pattern 11e transmitting the light having the phase opposite to that of main pattern portion 11A may be provided at the position within $\sqrt{(1\times G\times\lambda)}$ from at least the outline portion of main pattern portion 11A. This means that the center position of the opening of first auxiliary pattern 11e exists in the region within $\sqrt{(1\times G\times\lambda)}$ from the outline portion of main pattern portion 11A. When first auxiliary pattern 11e has the linear opening shape, the center line in the extending direction of first auxiliary pattern 11e exists in the region.

Similarly, second auxiliary pattern 11f transmitting the light having the phase identical to that of main pattern portion 11A may be provided at the position within $\sqrt{(1\times G\times 2\times\lambda)}$ from at least the outline portion of main pattern portion 11A. Similarly, third auxiliary pattern 11g transmitting the light having the phase opposite to that of main pattern portion 11A may be provided at the position within $\sqrt{(1\times G\times 3\times\lambda)}$ from at least the outline portion of main pattern portion 11A. The approximation is calculated under the condition of G>>λ when the positions of auxiliary patterns 11e to 11g are calculated from main pattern portion 11A.

When the positions of auxiliary patterns 11e to 11g are expressed by specific numerical values, D1≅4.3 μm, D2≅6.1 μm, and D3≅7.4 μm are obtained at wavelength λ of 365 nm of exposure light with the gap length G of 50 μm from exposed body 14.

In the second exemplary embodiment, some of the plurality of auxiliary patterns 11e to 11g constituting auxiliary pattern portion 11B have the phase shifter that transmits the light having the phase opposite to that of main pattern portion 11A. However, the principle for the components of auxiliary patterns 11e to 11g is the same as the contents described with reference to FIGS. 9A to 10D, namely the case of in-phase auxiliary patterns 11a to 11c.

FIGS. 18A and 18B again illustrate the amplitude distribution shown in FIG. 11A and the phase distribution shown in FIG. 11B. The amplitude distribution in FIG. 18A and the phase distribution in FIG. 18B are to the same as the distributions in FIGS. 11A and 11B. The consideration of the phase distribution in FIG. 18B differs from that of the distributions in FIGS. 11A and 11B. Auxiliary patterns 11e and 11g are arranged in the region close to 180° of the phase distribution because auxiliary patterns 11e and 11g are constructed with the phase shifter that shifts the light to the light having the phase opposite to that of main pattern portion 11A. For example, as illustrated in FIG. 18B, the preferable region of the opening having the phase of 180° is arranged in the region closer to the main pattern portion than the preferable region of the opening having the phase of 0° in FIG. 11B.

In other words, the phase shifter transmitting the light having the opposite phase is provided in the region, in which the light blocking part is provided when auxiliary patterns 11a to 11c are formed in the first exemplary embodiment. The light blocking part is provided such that the light having the opposite phase is prevented from being transmitted through each of auxiliary patterns 11a to 11c to negatively affect the interference in the outline portion of the desired pattern.

In auxiliary patterns 11e to 11g of the second exemplary embodiment, the auxiliary pattern transmitting the light having the phase identical to that of main pattern portion 11A (for example, second auxiliary pattern 11f) is provided at the position within $\sqrt{(2 \times G \times n \times \lambda)}$ in the outward direction of the outline portion of main pattern portion 11A, and the auxiliary pattern transmitting the light having the phase different from that of main pattern portion 11A (for example, first auxiliary pattern 11e and third auxiliary pattern 11g) is provided between the in-phase auxiliary pattern and main pattern portion 11A.

The arrangement positions of auxiliary patterns 11e and 11g transmitting the light having the phase different from that of main pattern portion 11A can be extracted from the phase distribution in FIG. 18B. In principle, the arrangement positions of auxiliary patterns 11e and 11g can be applied to any phase of the transmitted light. However, preferably the auxiliary pattern that generates the opposite phase is provided when only one auxiliary pattern constituting the phase shifter is provided between main pattern portion 11A and second auxiliary pattern 11f transmitting the light having the phase identical to that of main pattern portion 11A. This is because the plurality of auxiliary patterns can evenly be arranged in the surrounding of main pattern portion 11A. From the viewpoint of falling within the region where the light phase becomes opposite, the opposite phase may fall within the range of 180°±90° in terms of the phase difference with the light transmitted through main pattern portion 11A. When the phase difference with the light transmitted through main pattern portion 11A falls within the range of 180°±45°, the region that is separated by the light blocking part can surely be provided between first auxiliary pattern 11e and second auxiliary pattern 11f transmitting the light having the phase identical to that of main pattern portion 11A.

Similarly to the first exemplary embodiment, the term "the auxiliary pattern transmitting the light having the phase identical to that of main pattern portion 11A (for example, second auxiliary pattern 11f) is provided at the position within $\sqrt{(2 \times G \times n \times \lambda)}$ in the outward direction of the outline portion of main pattern portion 11A" does not means that the whole auxiliary pattern is included in the region within $\sqrt{(2 \times G \times n \times \lambda)}$ from the outline portion of the main pattern portion. It means that the center line in the extending direction of the auxiliary pattern is included in the region when the auxiliary pattern is formed into the linear shape.

Accordingly, in the configuration of the second exemplary embodiment, the auxiliary pattern transmitting the light having the phase different from that of the main pattern portion is provided between the plurality of auxiliary patterns. Particularly, in order to decrease the number of auxiliary patterns, the auxiliary pattern transmitting the light having the phase opposite to that of the main pattern portion is provided while restricted to one phase. When two auxiliary patterns having different phases are provided between the auxiliary patterns transmitting the light having the phase identical to that of the main pattern portion, the two auxiliary patterns having the phases of 120° and 240° may be provided. In the general expression, the auxiliary patterns having n different phases are provided between the auxiliary patterns transmitting the light having the phase identical to that of the main pattern portion, and each phase is expressed by 360°/(n+1)×m (where n and m are both natural numbers and m=1, 2, 3, . . . , and n). However, this is the expression in the complete state. When the phase shifter expressed by 360°/(n+1)×m is provided at the proper position where the light intensity is intensified in the outline portion of the desired pattern, all the auxiliary patterns having n different phases are not necessarily provided between the auxiliary patterns transmitting the light having the phase identical to that of the main pattern portion or between the auxiliary patterns having the phase identical to that of the main pattern portion.

Similarly, when the plurality of auxiliary patterns transmitting the light having the phase identical to that of the main pattern portion are provided in the first exemplary embodiment, all the plurality of auxiliary patterns are not necessarily provided at all the favorable positions. The term "the phase shifter expressed by 360°/(n+1)×m is provided at the proper position where the light intensity is intensified in the outline portion of the desired pattern" means that the phase shifter is provided at the position within $\sqrt{(2 \times G \times \lambda \times m/(n+1))}$ from the outline portion of the main pattern portion for the auxiliary pattern located closest to the main pattern.

In other words, when the auxiliary pattern transmitting the light having the phase opposite to that of the main pattern portion is more specifically expressed, the opposite-phase auxiliary pattern arranged closest to the main pattern portion may be provided at the position of $\sqrt{(2 \times G \times \lambda \times 0.5)}$, and the second opposite-phase auxiliary pattern provided outside may be provided at the position of $\sqrt{(2 \times G \times \lambda \times 1.5)}$. Accordingly, the n-th opposite-phase auxiliary pattern provided in the surrounding of the main pattern portion is located at the position of $\sqrt{(2 \times G \times \lambda \times (n-0.5))}$.

In principle, the auxiliary pattern transmitting the light having the opposite phase in the second exemplary embodiment can have the configuration similar to that of the auxiliary pattern transmitting the light having the phase identical to that of the main pattern portion in the first exemplary embodiment. The different-phase auxiliary pattern in the second exemplary embodiment differs from the auxiliary pattern in the first exemplary embodiment only in the distance from the outline portion of the main pattern portion.

Similarly to the first exemplary embodiment, the light blocking part is provided between the auxiliary patterns. Therefore, in the outline portion of the desired pattern, the undesirable light is not transmitted through the auxiliary pattern when the light intensity is intensified by the interference of light. Similarly to the first exemplary embodiment, the opening width of at least the auxiliary pattern provided near the main pattern portion may be larger than wavelength of the exposure light, and greater than or equal to double wavelength of the exposure light. Therefore, the light interference effect can sufficiently be exerted. The interval between the first auxiliary pattern and the second auxiliary pattern, namely, the width size of the light blocking part provided between the first auxiliary pattern and the second auxiliary pattern may be larger than wavelength of the exposure light.

Specifically, the interval between the first auxiliary pattern and the second auxiliary pattern is comparable to $(\sqrt{(2 \times G \times \lambda)} - \sqrt{(G \times \lambda)})$. The interval between the first auxiliary pattern and the second auxiliary pattern may be greater than or equal to double wavelength of the exposure light, or four times or more wavelength of the exposure light. For example, in the second exemplary embodiment, gap length G larger than at least 8.6 μm may be used in the exposure at wavelength λ of 365 nm of exposure light, and gap length G of 34.4 μm or more may be used in the exposure.

Figure 18A:
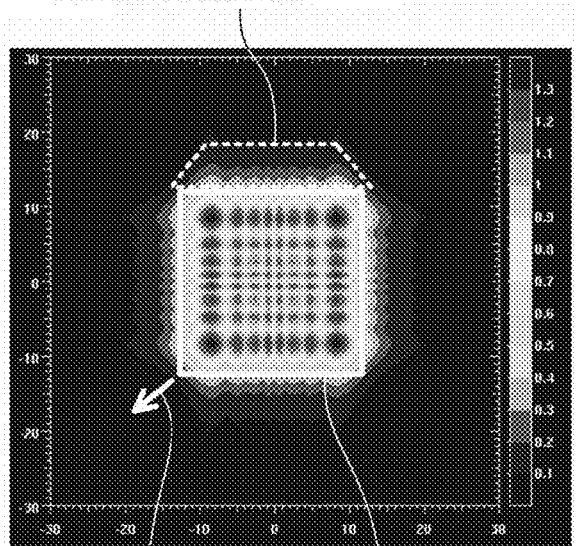
FIG. 18A is a view illustrating the amplitude distribution on the light propagation plane for explaining a principle of preparing the auxiliary pattern of the photomask of the second exemplary embodiment.
Figure 18B:
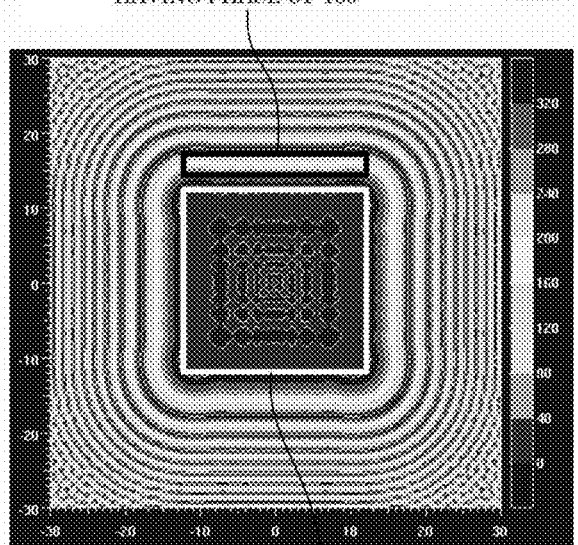
FIG. 18B is a view illustrating the phase distribution on the light propagation plane for explaining a principle of preparing the auxiliary pattern of the photomask of the second exemplary embodiment.

The actual result of the mask pattern directly calculated from the amplitude distribution and phase distribution in FIGS. 18A and 18B is described below. In the mask pattern producing method, the region where the phase distribution becomes the vicinity of 0° and the region where the phase distribution becomes the vicinity of 180° are extracted as the opening. The auxiliary pattern is calculated such that the opening width of the auxiliary pattern increases in proportion to the intensity of the amplitude distribution on the light propagation plane. At this point, the vicinity of 0° of the phase distribution and the vicinity of 180° of the phase distribution mean that the phase distribution may have the width to a degree that does not negatively affect the light influence, specifically, the phase distribution may have the width within ±45°. Those do not mean that the phase distribution has the values extremely close to 0° and 180°.

Figure 19A:
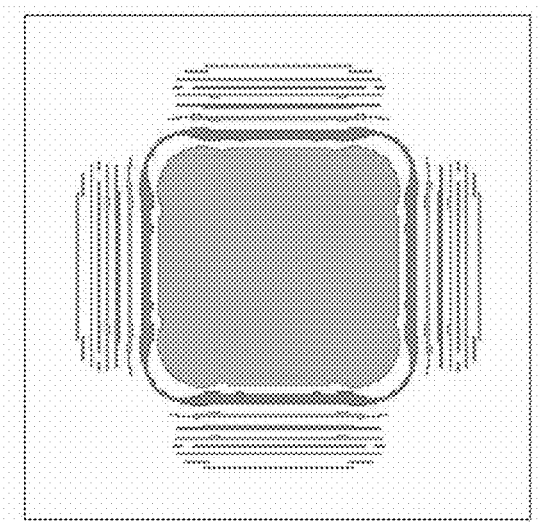
FIG. 19A is a plan view illustrating an example in which a mask pattern is prepared based on the principle of preparing the auxiliary pattern of the photomask of the second exemplary embodiment.
Figure 19B:
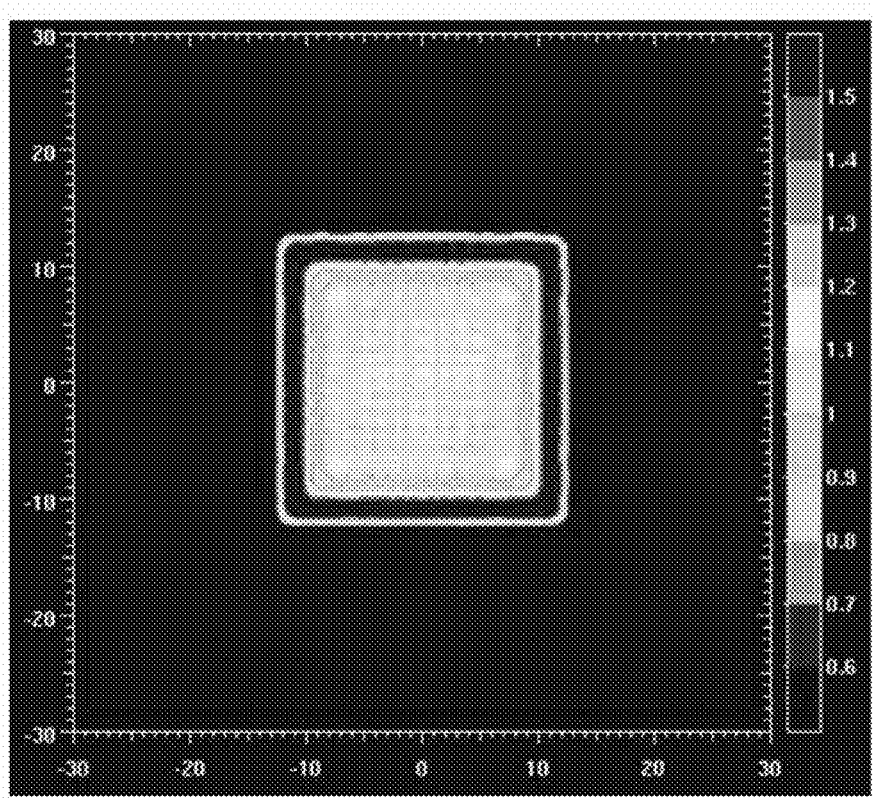
FIG. 19B is a view illustrating a simulation result when the photomask in FIG. 19A is exposed.

FIG. 19A illustrates a mask drawing calculated by the algorithm. It is found that the preferable configuration of the first and second exemplary embodiments is implemented in the main pattern portion and the auxiliary pattern portion. FIG. 19B illustrates a simulation result when the mask drawing is exposed. As to the exposure condition, wavelength λ of exposure light is set to 365 nm and gap length G is set to 50 μm. A collimation angle of the light source is set to 1.5°. The light intensity distribution transferred to the exposed body has a high-contrast outline image that the light intensity is increased in the outline portion of the desired pattern. The high-contrast outline image has a good shape with little distortion with respect to the shape of the desired pattern. It is also found that the outline portion of the desired pattern is more intensified and clarified compared with the simulation result of the first exemplary embodiment in FIG. 12B. In this case, the different-phase auxiliary pattern transmitting the opposite-phase light to intensify the outline portion of the desired pattern is added between the in-phase auxiliary patterns constituting the configuration of the first exemplary embodiment. Therefore, the outline portion of the desired pattern is more correctly intensified than the first exemplary embodiment.

Modification of Second Exemplary Embodiment

Not only the simple pattern shape including the fine size that can be hardly formed with the conventional proximity exposure method but also any pattern shape that has continuously formed shapes having different sizes in the line widths is described below as a modification of the second exemplary embodiment.

Figure 20A:
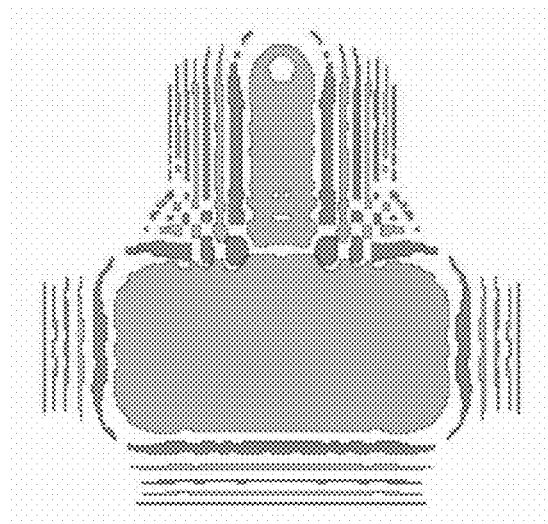
FIG. 20A is a plan view illustrating a photomask according to a modification of the second exemplary embodiment.
Figure 20B:
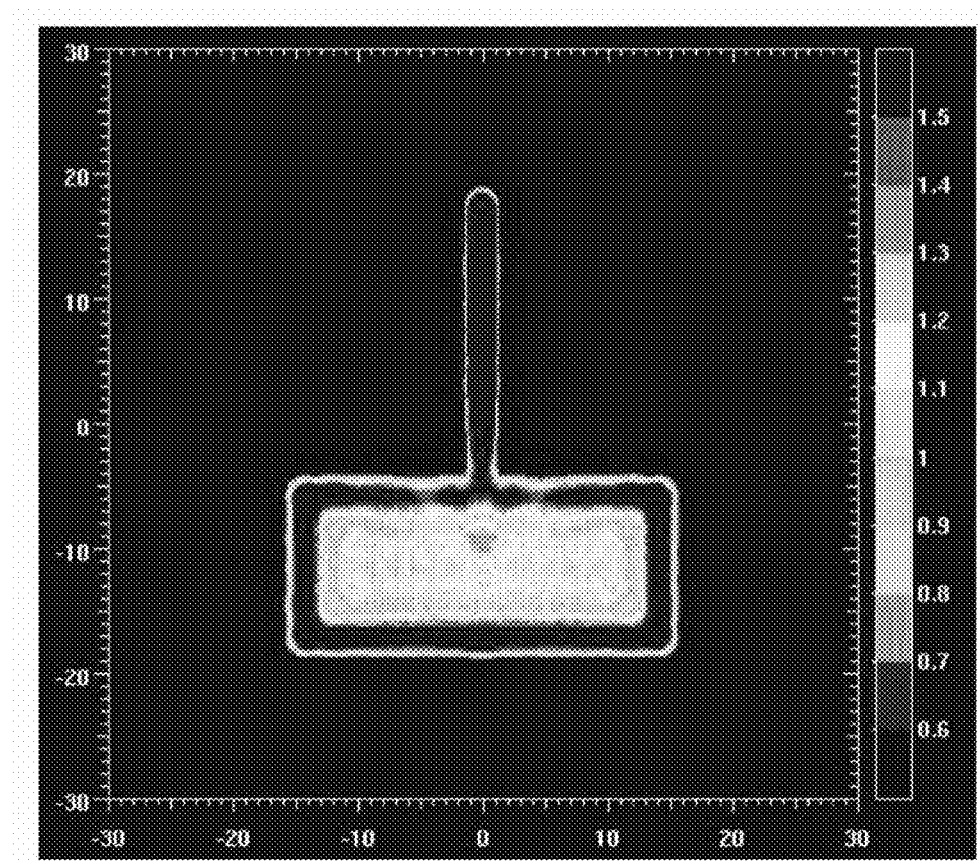
FIG. 20B is a view illustrating a simulation result when the photomask of the modification of the second exemplary embodiment is used.

FIGS. 20A and 20B illustrate results in which the second exemplary embodiment is applied to the desired pattern of the first modification of the first exemplary embodiment in FIG. 13A. FIG. 20A illustrates a photomask that is calculated based on the amplitude distribution and phase distribution on the propagation plane generated in exposing the desired pattern by the projection exposure method. The photomask in FIG. 20A satisfies the configuration of the present disclosure in the main pattern portion and the auxiliary pattern portion.

FIG. 20B illustrates a simulation result when the exposure is performed using the photomask in FIG. 20A. As to the exposure condition, wavelength λ of exposure light is set to 365 nm and gap length G is set to 50 μm. The collimation angle of the light source is set to 1.5°. From the result in FIG. 20B, similarly to the first exemplary embodiment, it is found that the pattern having the width of 2 μm, which is smaller than $\sqrt{(\lambda \times G)}$ hardly formed by the conventional method, is formed in high contrast. Similarly to the result in FIG. 19B, it is found that the outline portion of the desired pattern is more clearly intensified.

Similarly to the first exemplary embodiment, also in the auxiliary pattern of the second exemplary embodiment, the desired pattern may be provided regardless whether or not the desired pattern has the resolution limit size of the conventional proximity exposure method. Particularly, the auxiliary pattern may be provided in the region less than or equal to the size defined by $\sqrt{(\lambda \times G)}$.

As described above, in the first exemplary embodiment, the modifications of the first exemplary embodiment, the second exemplary embodiment, and the modification of the second exemplary embodiment, it can be formed by the proximity exposure method that the transfer image in which the light intensity of the light transmitted through the photomask is intensified in the outline portion of the desired pattern. That is, the resolution can considerably be improved in the proximity exposure method, and the pattern having little distortion can be formed with respect to the desired pattern shape.

Third Exemplary Embodiment

A pattern data producing method according to a third exemplary embodiment is described below with reference to FIG. 21.

Figure 21:
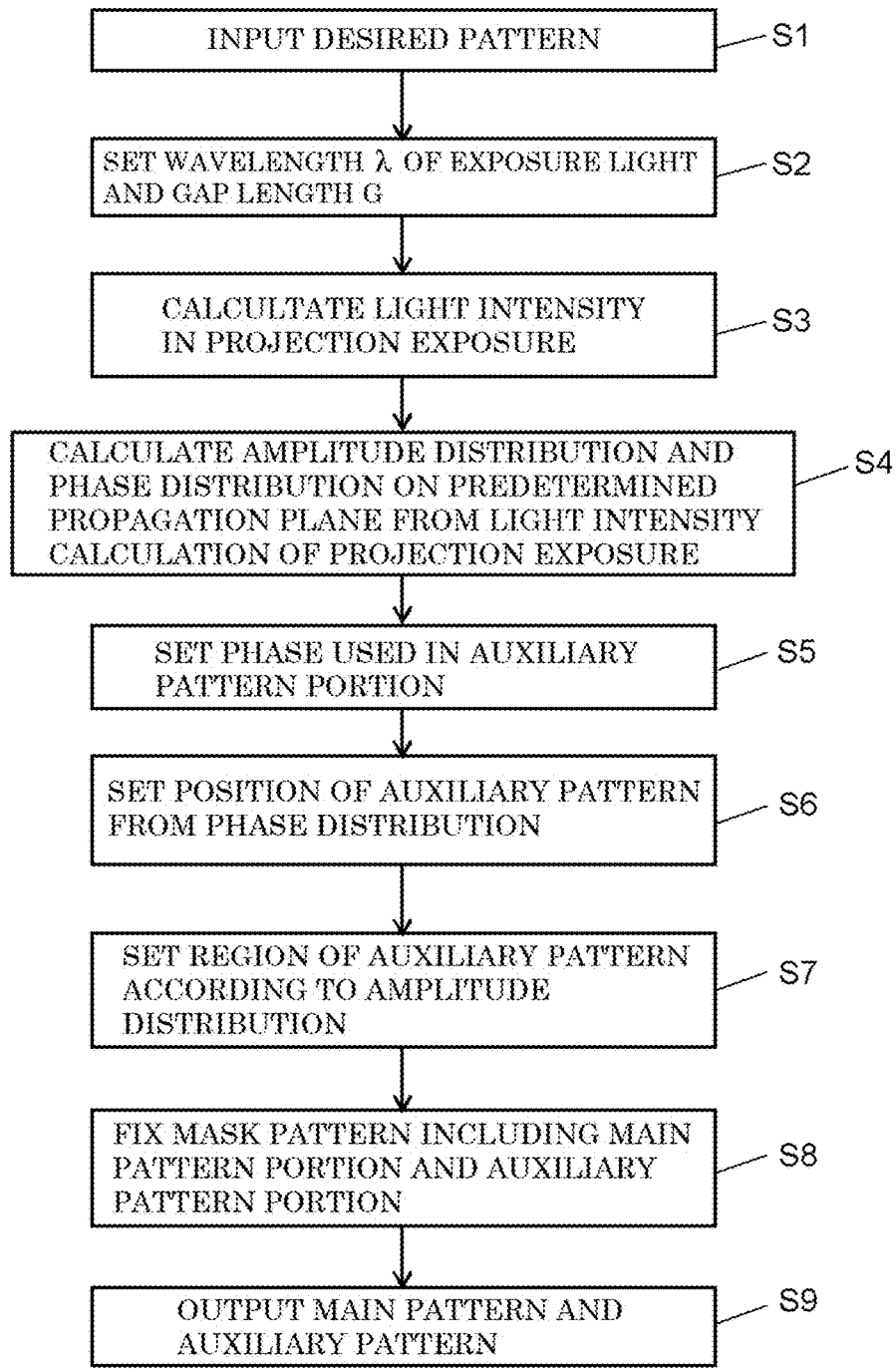
FIG. 21 is a flowchart illustrating an example of a method for producing pattern data of a photomask according to a third exemplary embodiment.

FIG. 21 illustrates a pattern data producing method of the third exemplary embodiment, specifically, a process flow of a method for producing graphic data constituting the opening pattern of the photomask used in the proximity exposure method. FIGS. 22 to 26B illustrate an example of the specific data in each process of the pattern data producing method of the third exemplary embodiment.

Figure 22:
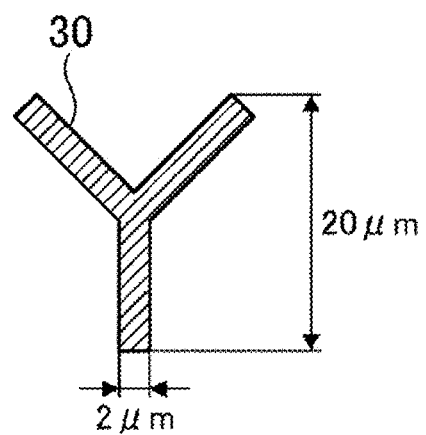
FIG. 22 is a plan view illustrating an example of the pattern used in the method for producing data of the photomask of the third exemplary embodiment.

FIG. 22 illustrates the desired pattern to be formed by the mask pattern. FIG. 22 illustrates pattern 30 that is transferred to the region where a resist film is exposed to the light by irradiation using the photomask of the present disclosure.

In the third exemplary embodiment, the pattern formation is described on the assumption that a negative resist process is used unless otherwise noted. It is presumed that the desired pattern is left as the resist pattern in the region irradiated with the light after the development. On the other hand, the use of a positive resist process is similar to the negative resist process except that the pattern in which the resist is removed in the region irradiated with the light is formed.

In Step S1 of FIG. 21, the desired pattern is input. For example, desired pattern 30 in FIG. 22 is input to a pattern data producing device including a computer.

In Step S2 of FIG. 21, wavelength λ of exposure light and gap length G are set. Wavelength λ and gap length G of the light source used in the exposure of the photomask are set to prepare a proximity exposure photomask.

In Step S3 of FIG. 21, the light intensity is calculated in the projection exposure method. The transfer image is calculated as the data (mask data) of the desired pattern when the exposure is performed by the projection exposure method. At this point, although originally the desired pattern is directly used as the pattern data, a bias such as magnification and contraction may be performed according to the final exposure condition, or an adjustment may be performed such that the corner is rounded in order to simplify the pattern data. A numerical aperture NA corresponding to a radius of the projection lens is also set because of the calculation in which the projection exposure method is used.

In Step S4 of FIG. 21, the amplitude distribution and the phase distribution of the light on the predetermined propagation plane are calculated from the light intensity calculation of the projection exposure method. In the projection exposure calculation of Step S4, the transfer image on a virtual plane is calculated at the position that is deviated onto the lens side by gap length G set in Step S2 with respect to the position where the highest contrast of the transfer image is obtained in the best focus, namely, with the ideal lens. That is, the transfer image on propagation plane 23 in FIG. 9A is calculated as described in the structure of the projection exposure of the first exemplary embodiment. The calculated transfer image is not the light intensity expressing an energy distribution, but the light amplitude and the phase distribution on the propagation plane.

Figure 23A:
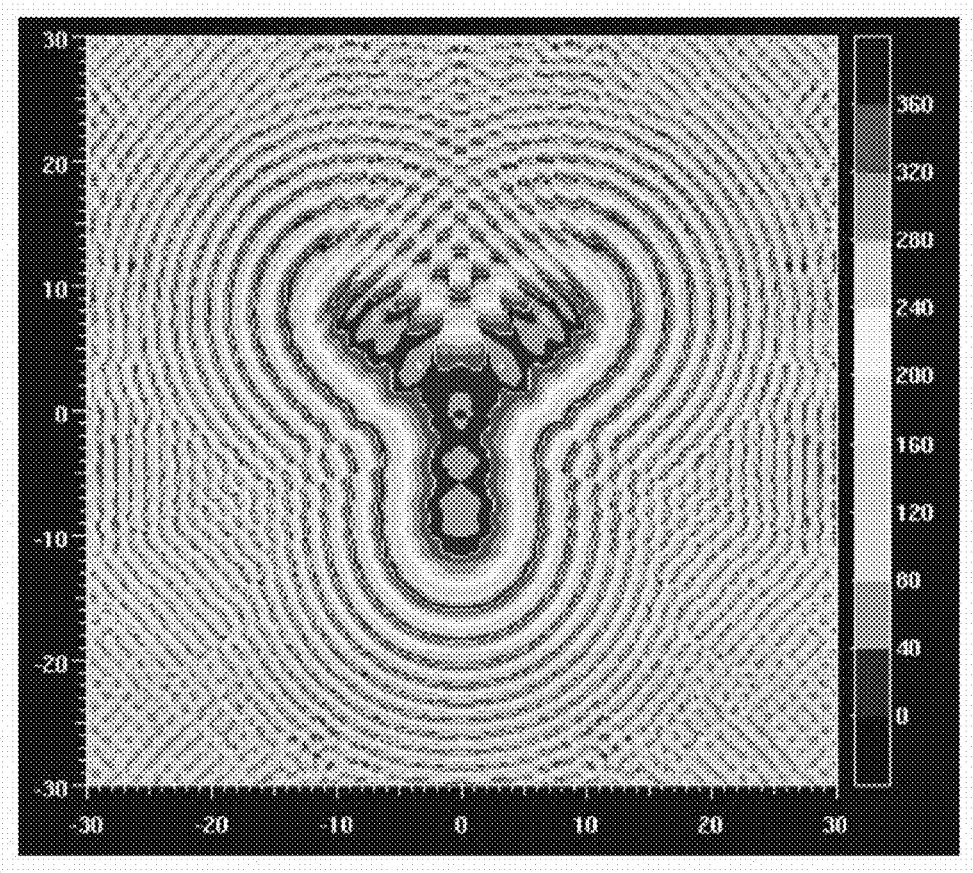
FIG. 23A is a phase distribution diagram illustrating an example of specific data in each process of the pattern data producing method of the third exemplary embodiment.
Figure 23B:
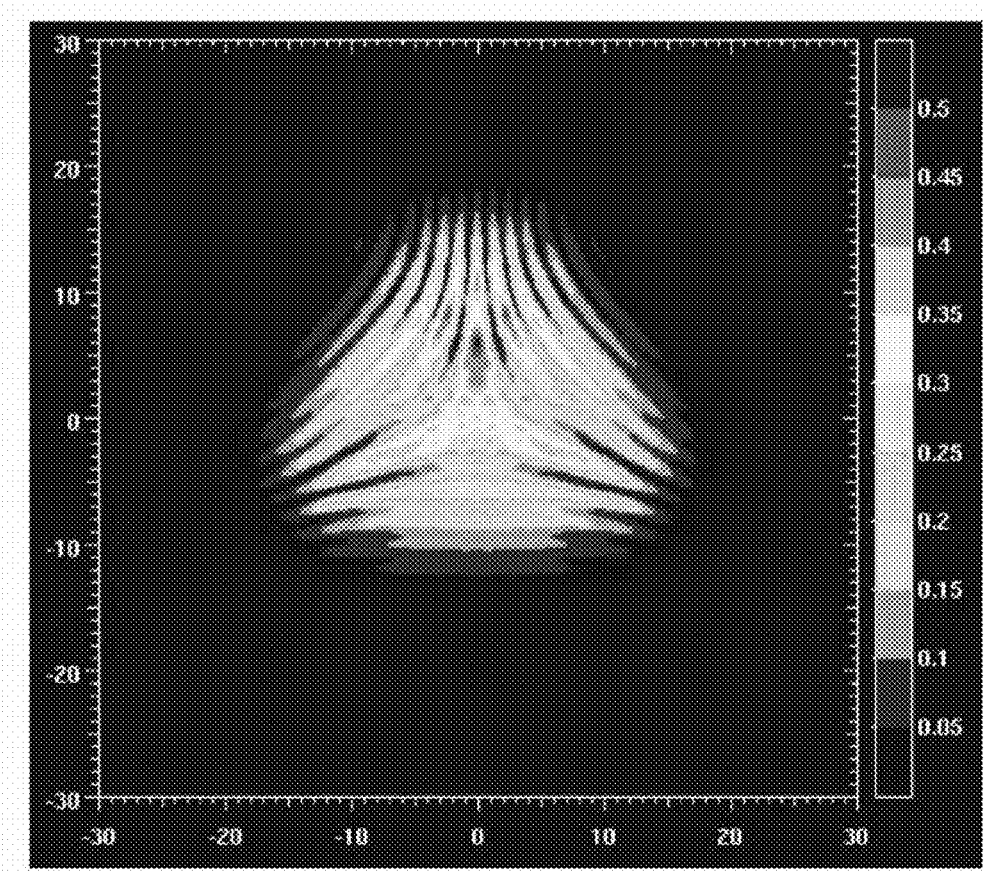
FIG. 23B is an amplitude distribution diagram illustrating an example of the specific data in each process of the pattern data producing method of the third exemplary embodiment.
Figure 24A:
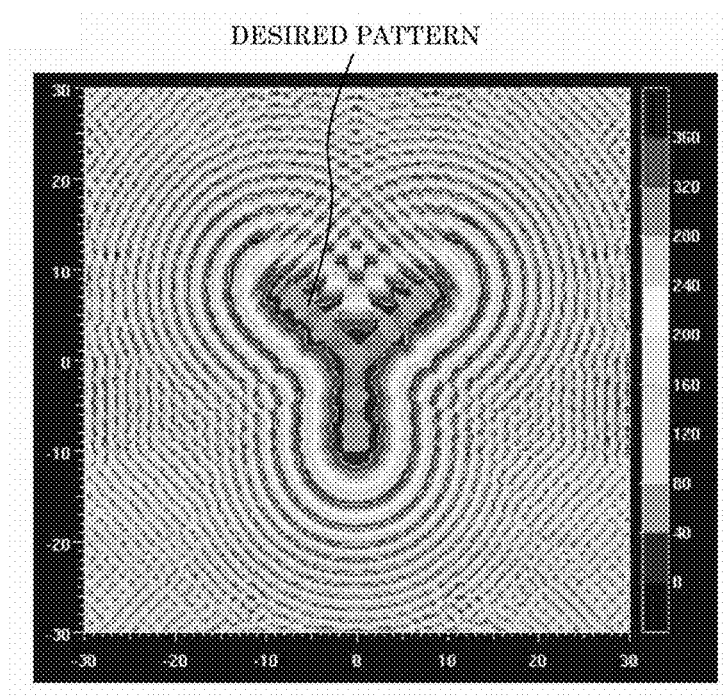
FIG. 24A is a phase distribution diagram illustrating an example of the specific data in each process of the pattern data producing method of the third exemplary embodiment.
Figure 24B:
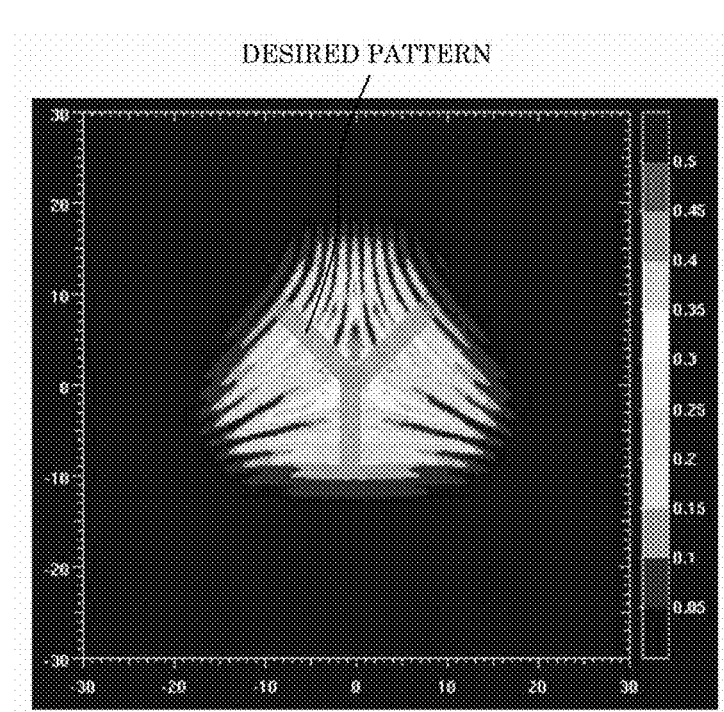
FIG. 24B is an amplitude distribution diagram illustrating an example of the specific data in each process of the pattern data producing method of the third exemplary embodiment.

FIGS. 23A and 23B illustrate the phase distribution and amplitude distribution on the propagation plane, which are calculated at wavelength $\lambda$ of 365 nm of exposure light with numerical aperture NA of 0.3 and gap length G of 50 µm using the mask graphic in FIG. 23A.

In Step S5 of FIG. 21, the phase of the light transmitted through the auxiliary pattern portion is set. A kind of the phase set to the auxiliary pattern portion as the proximity exposure mask and the value of each phase are fixed. Only one phase of the light is used when the phase of the light transmitted through the main pattern portion is identical to that of the light transmitted through the auxiliary pattern portion. A plurality of values can be set to the phase. However, in this case, because the phase of the light transmitted through the main pattern portion is set to 0°, the phase of the light transmitted through the auxiliary pattern portion is also set to 0°. As described above with reference to FIGS. 1A to 1C, at least one auxiliary pattern is collectively referred to as the auxiliary pattern portion.

In Step S6 of FIG. 21, the position of the auxiliary pattern is set from the phase distribution calculated in Step S4. The position where each auxiliary pattern is provided is extracted from the phase distribution obtained in Step S4. Specifically, the position where the phase becomes 0°, the position corresponding to the outline portion of the desired pattern, is extracted from the phase distribution in FIG. 23A.

In Step S7 of FIG. 21, the region of the auxiliary pattern is set according to the amplitude distribution calculated in Step S4. The opening size of the opening that should be provided at each auxiliary pattern position extracted in Step S6 is set. The opening size is set using the amplitude in FIG. 23B. For example, the auxiliary pattern having the large opening width is provided when the amplitude is large at the position where the phase of the light becomes 0°. On the other hand, the auxiliary pattern having the small opening width is provided when the amplitude is small. When the amplitude is smaller than a predetermined value, it is not necessary to provide the auxiliary pattern. For the sake of easy understanding, in FIGS. 24A and 24B, the pattern corresponding to the desired pattern is indicated in each of the phase distribution and the amplitude distribution.

Figure 25A:
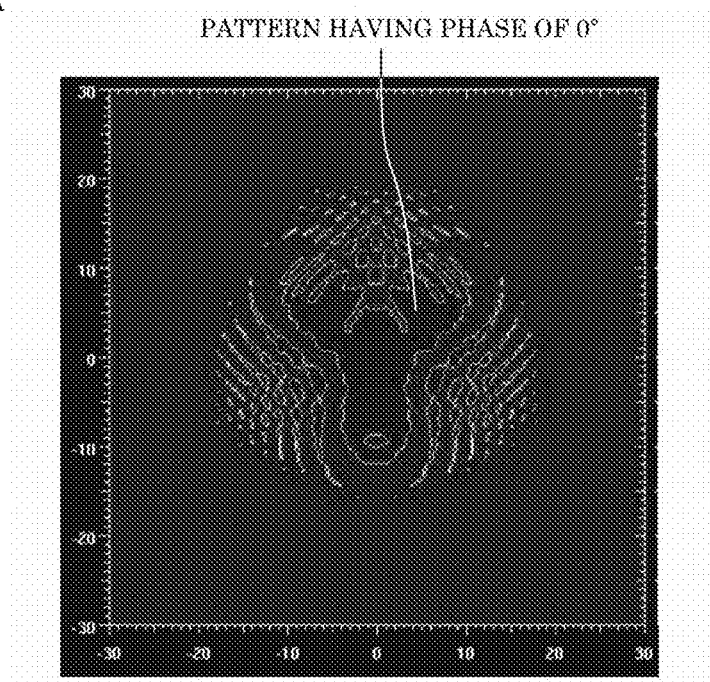
FIG. 25A is a plan view illustrating the photomask prepared by the pattern data producing method of the third exemplary embodiment.

In Step S8 of FIG. 21, the mask pattern including the main pattern portion and the auxiliary pattern portion is fixed. That is, the auxiliary pattern portion set in Steps S6 and S7 is fixed as the mask pattern together with the main pattern portion. The main pattern portion may be a simply-magnifying graphic in which the desired pattern is directly magnified. However, the main pattern portion may be obtained by the same algorithm as the auxiliary pattern portion in order to calculate the graphic data of the mask that yields the pattern shape more faithful to the desired pattern. The calculation of the main pattern portion differs from that of the auxiliary pattern portion in that the position of the pattern is defined by the phase of the desired pattern corresponds to the position of 0° instead of the phase in the outer periphery of the desired pattern corresponds to the position of 0°. FIG. 25A illustrates the mask graphic including the main pattern portion and the auxiliary pattern portion, which are actually calculated using the algorithm.

In Step S9 of FIG. 21, the main pattern portion and the auxiliary pattern portion, which are produced in Steps S1 to S8, are output as the mask data to prepare the desired photomask.

Figure 25B:
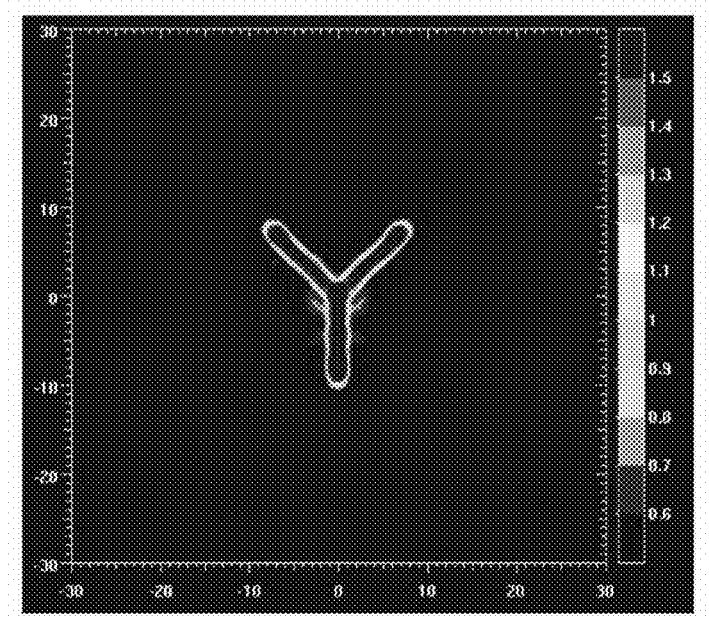
FIG. 25B is a view illustrating a simulation result in which the photomask prepared by the pattern data producing method of the third exemplary embodiment is used.

By using the photomask prepared in the above-described Steps S1 to S9, the light transmitted through the main pattern portion and the light transmitted through the auxiliary pattern portion are intensified by the interference in the outline portion of the desired pattern, so that the desired pattern can be formed in high contrast. Because the resolution of the pattern produced by the pattern data producing method of the third exemplary embodiment is substantially equal to that of the projection exposure method, the resolution depends on numerical aperture NA of the virtual lens used in Step 3. That is, the resolution of the pattern obtained in the third exemplary embodiment is fixed by $\lambda$/NA expressing the resolution in the projection exposure method. In the case that the width of the desired pattern is less than or equal to about $2 \times \lambda$/NA, the transfer image in which the center of the pattern is emphasized is actually formed because the width is not enough to distinguish the outline portions on both the sides of the pattern from each other due to the resolution. FIG. 25B illustrates the simulation result of the light intensity distribution of the transfer image on the exposed body when the photomask in FIG. 25A is exposed by the proximity exposure method at wavelength $\lambda$ of 365 nm of exposure light with gap length G of 50 µm at the collimation angle of 1.5°.

Accordingly, in the third exemplary embodiment the size less than or equal to $\sqrt{(\lambda \times G)}$, which is hardly formed by the proximity exposure method in which the conventional normal mask is used, can be formed, the pattern data in which the good pattern having little distortion is formed with respect to the desired pattern, can be produced, and the photomask can be prepared using the pattern data.

In third exemplary embodiment, by way of example, the phase of the main pattern portion is identical to that of the auxiliary pattern portion. Alternatively, at least two different phases may be set to the auxiliary pattern portions.

Modification of Third Exemplary Embodiment

An example in which the two phases are set to the auxiliary patterns in the pattern data producing method is described below as a modification of the third exemplary embodiment. Alternatively, at least three phases may be set to the auxiliary patterns.

A specific example in which at least two light phases are set to the auxiliary pattern portions with respect to desired pattern 30 in FIG. 22 is described below. The results in steps S1 to S4 in the modification is the same as those of the third exemplary embodiment, and the results from Step S5 in the modification differs from those of the third exemplary embodiment. Accordingly, the flow from Step S5 is described below.

In Step S5 of FIG. 21, the phase of the light transmitted through the auxiliary pattern portion is set.

In the modification, another phase of 180° is set in addition to the phase of 0° set to the main pattern portion. Although any phase can be set from the viewpoint of principle and operation, preferably the light transmitted through the main pattern portion has the phase of 0°. Accordingly, the phases set to the auxiliary pattern portions may be obtained by evenly dividing 360°. This is because the interval between the auxiliary patterns on the photomask is increased and the light interference effect is expected to be enhanced.

In Step S6 of FIG. 21, the position of the auxiliary pattern is set from the phase distribution calculated in Step S4. In the phase distribution of FIG. 23B, the position where the phase becomes 0° and the position where the phase becomes 180° are extracted at the position corresponding to the outline portion of the desired pattern.

In Step S7 of FIG. 21, the region of the auxiliary pattern is set according to the amplitude distribution calculated in Step S4. In the modification, because only the auxiliary pattern having the phase of 180° is added as the auxiliary pattern setting position, the opening region setting processing is similar to that of the auxiliary pattern having the phase of 0°.

Figure 26A:
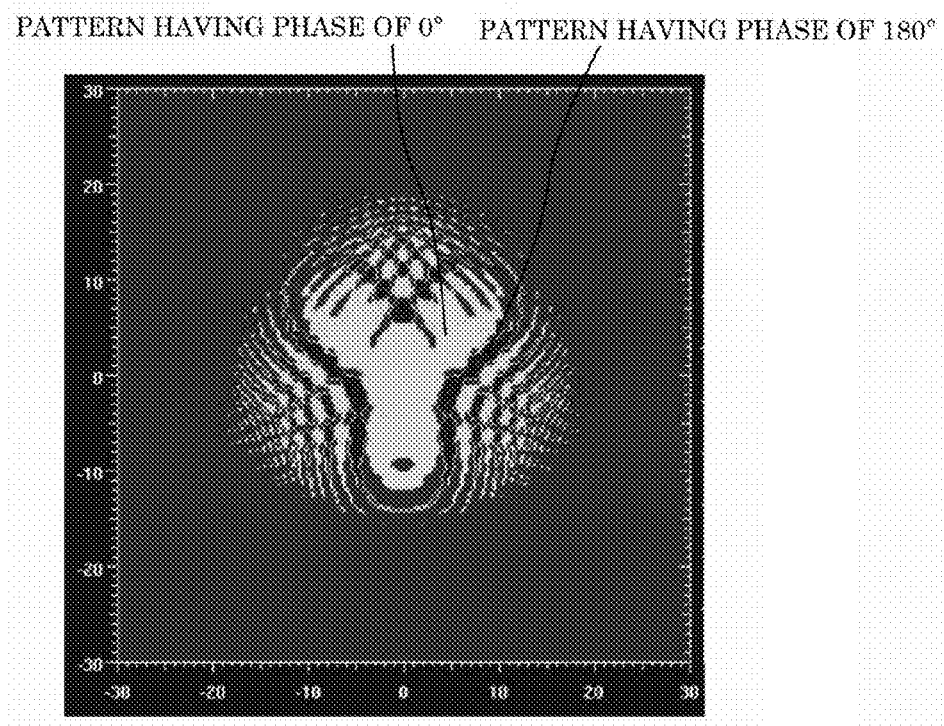
FIG. 26A is a plan view illustrating a photomask prepared by a pattern data producing method according to a modification of the third exemplary embodiment.

In Step S8 of FIG. 21, the mask pattern including the main pattern portion and the auxiliary pattern portion is fixed. In the modification, the light transmitted through the main pattern portion has the phase of 0°, and the light transmitted through the auxiliary pattern portions have the phase of 0° and 180°. The processing content is similar to that of the auxiliary pattern having the phase of 0°. FIG. 26A illustrates the mask graphic including the main pattern portion and the auxiliary pattern portion, which are calculated using the algorithm of the modification.

In Step S9 of FIG. 21, the main pattern portion and the auxiliary pattern portion, which are produced in Steps S1 to S8, are output as the mask data to prepare the desired photomask.

Figure 26B:
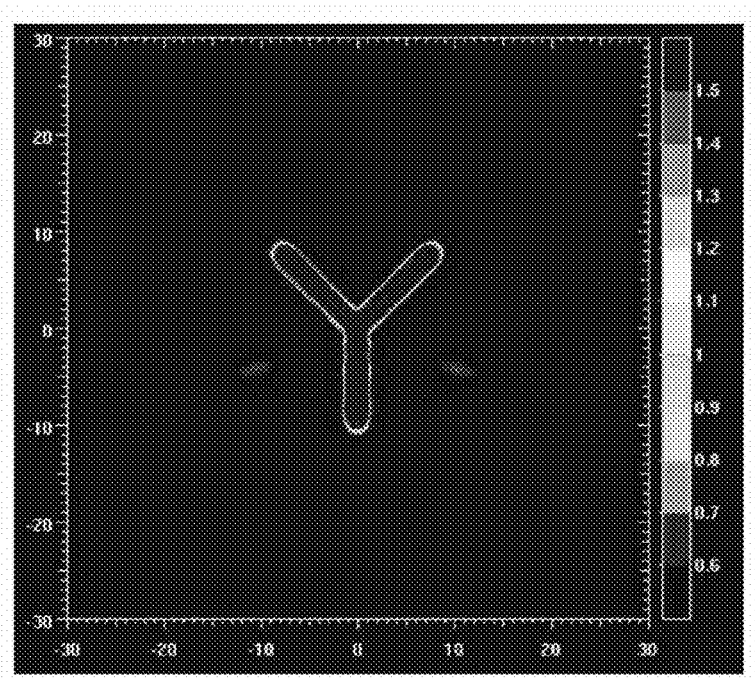
FIG. 26B is a view illustrating a simulation result in which the photomask prepared by the pattern data producing method of the modification of the third exemplary embodiment is used.

FIG. 26B illustrates the simulation result of the light intensity distribution of the transfer image on the exposed body when the photomask in FIG. 26A is exposed by the proximity exposure method at wavelength λ of 365 nm of exposure light with gap length G of 50 μm at the collimation angle of 1.5°. When FIG. 25B of the third exemplary embodiment is compared to FIG. 26B of the modification, the two phases are used as the phases of the light transmitted through the auxiliary pattern in the modification, and it is found that the transfer image is more clearly formed with respect to the desired pattern shape.

In the modification, the resolution equal to that of the projection exposure method is obtained in principle, and the projection exposure method is reproduced, so that the mask pattern that obtains a focal depth comparable to the projection exposure method can be made by the proximity exposure method.

Fourth Exemplary Embodiment

A fourth exemplary embodiment is described below with reference to the drawings.

In the fourth exemplary embodiment, a pattern forming method is described using the photomask of the first exemplary embodiment, the photomask of the second exemplary embodiment, or the photomask prepared by the pattern data producing method of the third exemplary embodiment.

FIGS. 27A to 27D schematically illustrate an example of each process in the pattern forming method of the fourth exemplary embodiment.

Figure 27A:
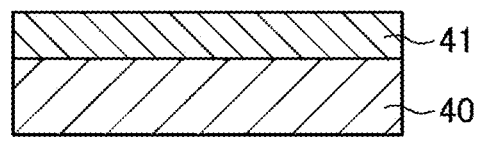
FIG. 27A is a schematic sectional view illustrating an example of a process procedure of a pattern forming method according to a fourth exemplary embodiment.

As illustrated in FIG. 27A, processed film 41 that is of a metallic film or an insulating film is formed on substrate 40.

Figure 27B:
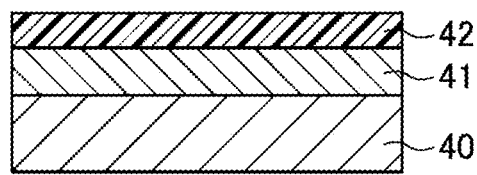
FIG. 27B is a schematic sectional view illustrating an example of the process procedure of the pattern forming method of the fourth exemplary embodiment.

As illustrated in FIG. 27B, for example, negative resist film 42 is deposited on processed film 41.

Figure 27C:
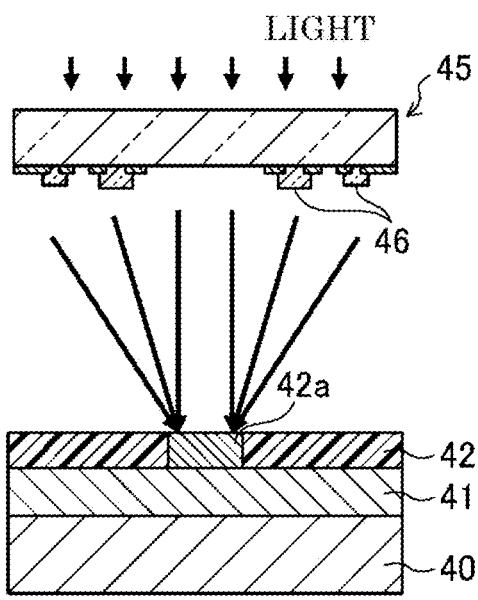
FIG. 27C is a schematic sectional view illustrating an example of the process procedure of the pattern forming method of the fourth exemplary embodiment.

As illustrated in FIG. 27C, for example, photomask 45 equivalent to photomask 12A of the second exemplary embodiment in FIG. 16A is irradiated with the exposure light, and resist film 42 is exposed to the transmitted light transmitted through photomask 45. The light transmitted through photomask 45 is collected in the outline portion of the main pattern portion of photomask 45, namely, phase shifter 46 that intensifies the light intensity by the interference is provided. More particularly, in the exposure process of FIG. 27C, resist film 42 is exposed with the exposure light source. At this point, the light transmitted through photomask 45 is collected above substrate 40, and resist film 42 is irradiated by energy of exposure light enough to solidify resist film 42 in the subsequent development process.

Figure 27D:
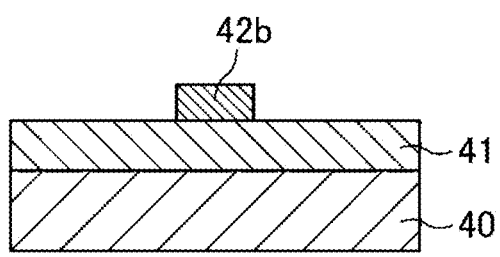
FIG. 27D is a schematic sectional view illustrating an example of the process procedure of the pattern forming method of the fourth exemplary embodiment.

As illustrated in FIG. 27D, exposed resist film 42 is developed to leave latent image portion 42a, and fine pattern 42b is formed from latent image portion 42a.

As described above, in the pattern forming method of the third exemplary embodiment, the light transmitted through photomask 45 is collected by phase shifter 46 provided in the opening of photomask 45, so that the fine pattern can be formed.

In the fourth exemplary embodiment, the negative resist process is used. The similar effect can be obtained using the positive resist process instead of the negative resist process.

Fifth Exemplary Embodiment

A fifth exemplary embodiment is described below with reference to the drawings.

In the fifth exemplary embodiment, a femtosecond laser processing method is described using the photomask of the first exemplary embodiment, the photomask of the second exemplary embodiment, or the photomask prepared by the pattern data producing method of the third exemplary embodiment.

In the femtosecond laser processing, normally a laser beam is collected by a lens to perform processing such as laser ablation cutting. In addition to the cutting, for example, a light waveguide, a three-dimensional memory device, a photonics crystal, and a micro-channel are prepared by selectively altering a transparent sample such as a glass material.

Figure 28:
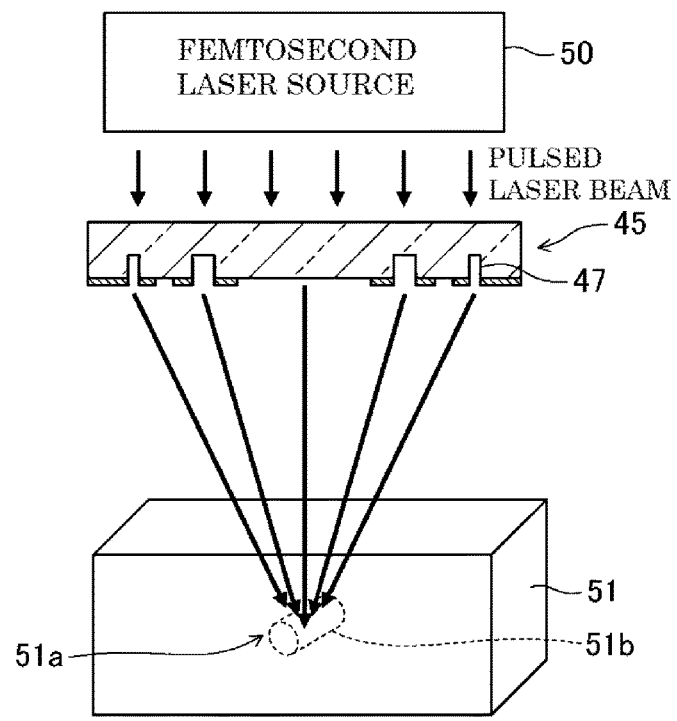
FIG. 28 is a schematic diagram illustrating an example of a processing method according to a fifth exemplary embodiment.
Figure 29:
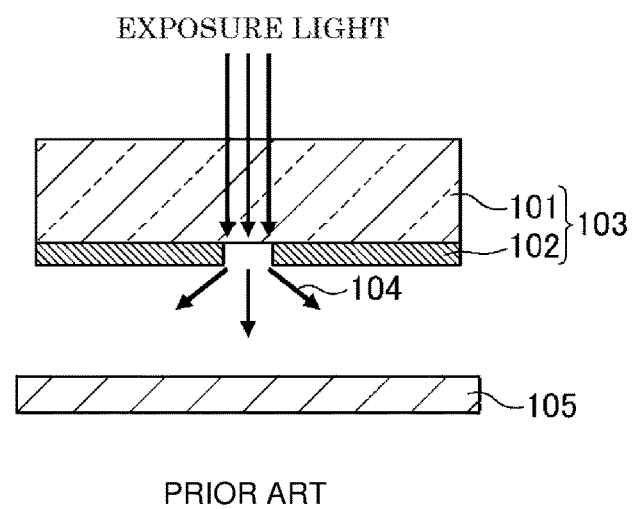
FIG. 29 is a schematic sectional view illustrating a fundamental problem in a conventional proximity exposure method.
Figure 30A:
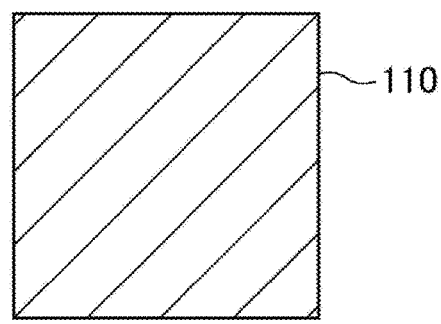
FIG. 30A is a plan view illustrating an example of a problem on a transfer pattern shape in the conventional proximity exposure method.
Figure 30B:
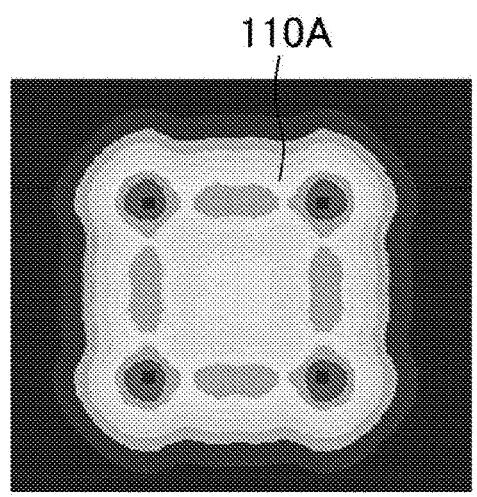
FIG. 30B is a plan view illustrating an example of the problem on the transfer pattern shape in the conventional proximity exposure method.
Figure 30C:
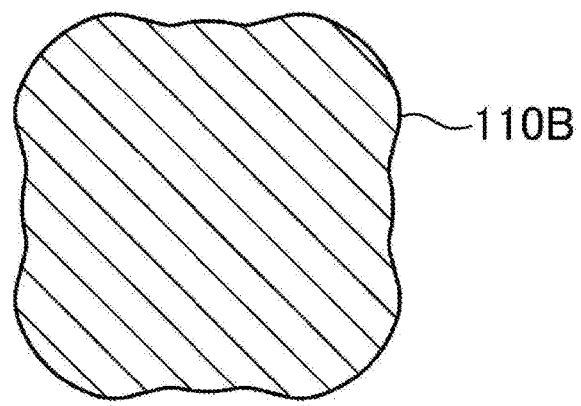
FIG. 30C is a plan view illustrating an example of the problem on the transfer pattern shape in the conventional proximity exposure method.
Figure 31A:
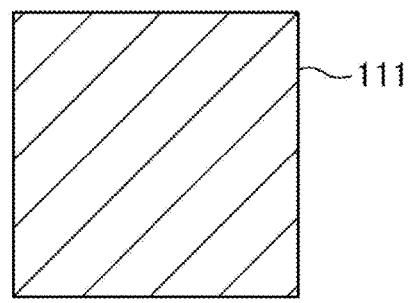
FIG. 31A is a plan view illustrating an example of a problem on the transfer pattern shape in a conventional projection exposure method and a problem solving method.
Figure 31B:
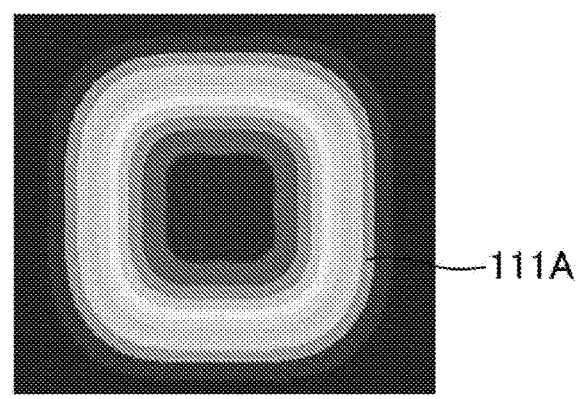
FIG. 31B is a plan view illustrating an example of the problem on the transfer pattern shape in the conventional projection exposure method and the problem solving method.
Figure 31C:
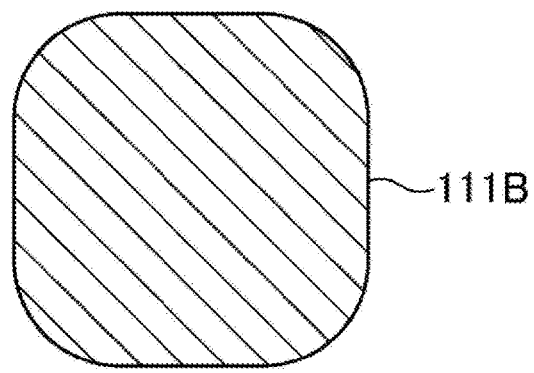
FIG. 31C is a plan view illustrating an example of a problem on the transfer pattern shape in the conventional projection exposure method and the problem solving method.
Figure 31D:
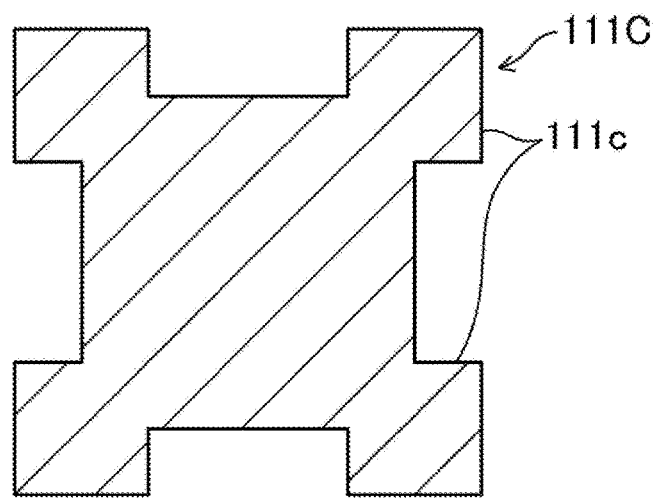
FIG. 31D is a plan view illustrating an example of a problem on the transfer pattern shape in the conventional projection exposure method and the problem solving method.
Figure 32A:
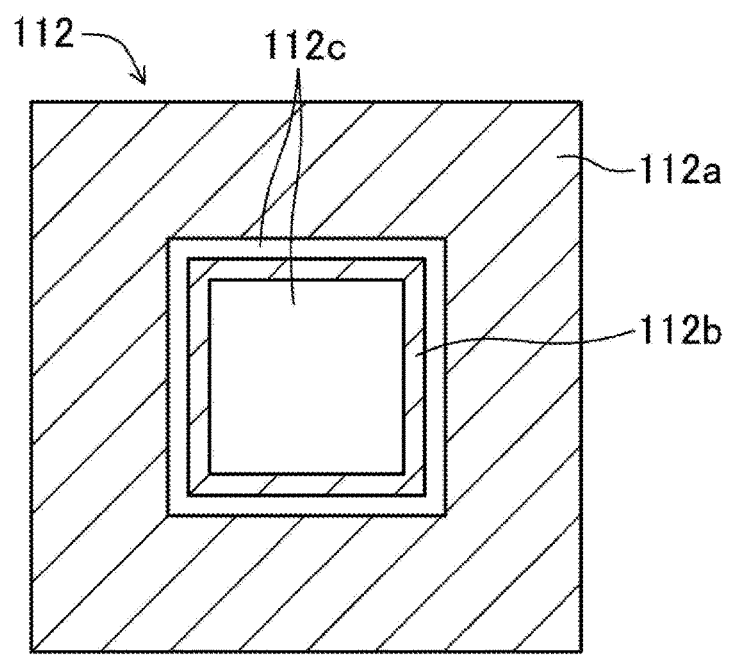
FIG. 32A is a plan view illustrating an example of the problem on the transfer pattern shape in the proximity exposure method and the problem solving method.
Figure 32B:
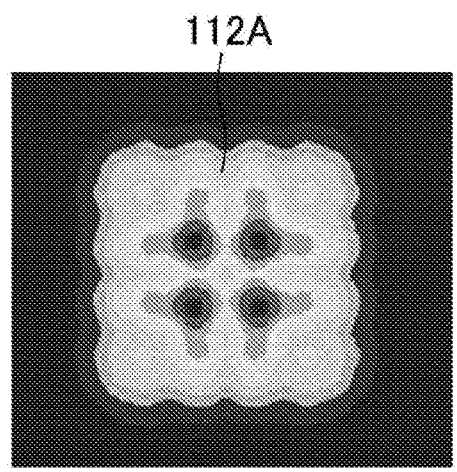
FIG. 32B is a plan view illustrating an example of the problem on the transfer pattern shape in the proximity exposure method and the problem solving method.
Figure 32C:
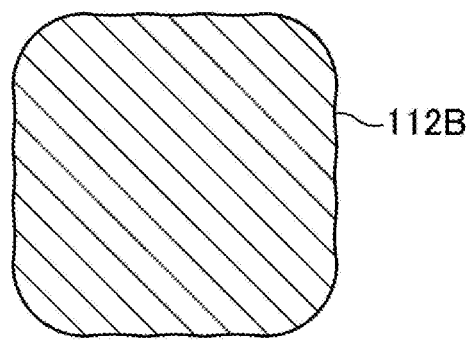
FIG. 32C is a plan view illustrating an example of the problem on the transfer pattern shape in the proximity exposure method and the problem solving method.

FIG. 28 illustrates a processing method of the fifth exemplary embodiment in which the femtosecond laser is used.

Photomask 45 of the fourth exemplary embodiment is irradiated with a femtosecond laser beam emitted from femtosecond laser source 50. The femtosecond laser beam has a pulse width in order of $10^{-13}$ second. At this point, for example, the photomask equivalent to photomask 12A of the second exemplary embodiment in FIG. 16B is used as photomask 45. The pattern is drawn in photomask 45 such that the image of the desired pattern is formed at the position separated by a predetermined distance. Specifically, the pattern of photomask 45 is drawn such that the laser beam is collected at the desired position in transparent sample 51 by phase shifter 47. Accordingly, transparent sample 51 is held at the position facing the surface (rear surface) on the opposite side to femtosecond laser source 50 with respect to photomask 45 such that pattern image forming position 51a of photomask 45 is located at a predetermined position in transparent sample 51. For example, the desired pattern is micro-channel 51b that is prepared in transparent sample 51.

In the fifth exemplary embodiment, the pattern drawn in photomask 45 is an example in which the image is formed in the region in transparent sample 51. Alternatively, a plurality of patterns in which the images are formed in a plurality of regions in transparent sample 51 are drawn in photomask 45, which allows stereoscopic micro-channel 51b to be collectively formed in transparent sample 51 without moving transparent sample 51. Even for photomask 45 including the plurality of patterns that can collectively be formed, the more complicated solid shape can efficiently be formed by properly moving transparent sample 51.

In the fifth exemplary embodiment, not only the photomask of the present disclosure forms the image of the pattern in the region, which faces the photomask and is separated by a predetermined gap length, but also the femtosecond laser processing can be performed by utilizing the function of the photomask that substantially collects the light by the interference to increase the light intensity. The use of the photomask including the desired pattern can eliminate the necessity of the lens, and collectively perform the desired processing.

In the photomask, the method for producing pattern data thereof, and the methods for forming and processing a pattern using the photomask of the above exemplary embodiments, the pattern smaller than the limit size that can be formed using the conventional mask can be formed by the exposure method such as the proximity exposure method. Therefore, the micro-fabrication can be performed at low cost. The proximity exposure method that enables the micro-fabrication and the equal-magnification projection exposure method can easily be applied to large-area processing and transparent sample processing.

What is claimed is:

1. A photomask comprising:
   a translucent substrate;
   a light blocking member provided on the translucent substrate for blocking exposure light;
   a main pattern portion provided in a first region of the light blocking member corresponding to a desired pattern, the main pattern portion being an opening of the light blocking member; and
   an auxiliary pattern portion provided in a second region of the light blocking member surrounding a position corresponding to the desired pattern and along a side constituting an outline portion of the desired pattern, the auxiliary pattern portion including a plurality of in-phase auxiliary patterns, each of the plurality of in-phase auxiliary patterns being an opening of the light blocking member transmitting in-phase light in which a phase is matched with a phase of light transmitted through the main pattern portion, wherein:
   each of the plurality of in-phase auxiliary patterns is provided at a distance of $\sqrt{(2 \times n \times G \times \lambda)}$ from the side constituting the outline portion of the desired pattern, and
   the exposure light transmitted through the auxiliary pattern portion is projected on an exposed body to form a projection image having light intensity emphasized at the side constituting the outline portion of the desired pattern (where G is a gap length between the photomask and the exposed body, $\lambda$ is a wavelength of the exposure light, and n is a natural number).

2. The photomask according to claim 1, wherein:
   the desired pattern includes a convex portion constructed with the side constituting the outline portion of the desired pattern, and
   each of the plurality of in-phase auxiliary patterns has a decreased size in width near the convex portion or has an end of the in-phase auxiliary pattern terminated near the convex portion.

3. The photomask according to claim 1, wherein:
   the plurality of in-phase auxiliary patterns include a first in-phase auxiliary pattern provided adjacent to the main pattern portion with a light blocking part of the light blocking member interposed therebetween, and
   the first in-phase auxiliary pattern is provided at a distance within $\sqrt{(2 \times G \times \lambda)}$ from the main pattern portion.

4. The photomask according to claim 3, wherein the first in-phase auxiliary pattern has a width larger than a wavelength of the exposure light.

5. The photomask according to claim 3, wherein the main pattern portion is a region having a size enlarged at least $(\sqrt{(2 \times G \times \lambda)})/8$ from the desired pattern.

6. The photomask according to claim 3, wherein a width of the light blocking part between the main pattern portion and the first in-phase auxiliary pattern is larger than a wavelength of the exposure light.

7. The photomask according to claim 3, wherein:
   the auxiliary pattern portion further includes a second in-phase auxiliary pattern provided adjacent to the main pattern portion with the first in-phase auxiliary pattern interposed therebetween, and
   the second in-phase auxiliary pattern is provided at a distance within $\sqrt{(4 \times G \times 2)}$ from the main pattern portion.

8. The photomask according to claim 7, wherein a light blocking part of the light blocking member is provided between the first in-phase auxiliary pattern and the second in-phase auxiliary pattern.

9. The photomask according to claim 7, wherein the second in-phase auxiliary pattern has a width smaller than a width of the first in-phase auxiliary pattern.

10. The photomask according to claim 3, wherein a different-phase auxiliary pattern is provided between the main pattern portion and the first in-phase auxiliary pattern, the different-phase auxiliary pattern being constructed with a phase shifter that transmits the exposure light with a phase different from a phase of the exposure light transmitted through the main pattern portion.

11. The photomask according to claim 1, wherein a different-phase auxiliary pattern is provided between the in-phase auxiliary patterns adjacent to each other, the different-phase auxiliary pattern transmitting the exposure light with a phase different from a phase of the exposure light transmitted through the main pattern.

12. The photomask according to claim 10, wherein the different-phase auxiliary pattern transmits the exposure light with a phase opposite to a phase of the exposure light transmitted through the main pattern.

13. The photomask according to claim 12, wherein a phase difference between the different-phase auxiliary pattern and the main pattern falls within 180°±45°.

14. The photomask according to claim 12, wherein the different-phase auxiliary pattern has a width larger than a wavelength of the exposure light.

15. The photomask according to claim 12, wherein a light blocking part of the light blocking member is provided between the in-phase auxiliary pattern and the different-phase auxiliary pattern.

16. The photomask according to claim 15, wherein the light blocking part has a width larger than a wavelength of the exposure light.

17. The photomask according to claim 1, wherein:
the desired pattern includes a convex portion constructed with the side constituting the outline portion of the desired pattern, and the in-phase auxiliary patterns provided in parallel to the side are decreased in number near the convex portion.

18. The photomask according to claim 1, wherein:
the desired pattern includes a thin line portion in which a line width is less than or equal to $\sqrt{(\lambda \times G)}$, and
the plurality of in-phase auxiliary patterns are provided along a side constituting the thin line portion.

19. The photomask according to claim 18, wherein:
the desired pattern further includes a thick line portion that is coupled to the thin line portion, the line width of the thick line portion being greater than or equal to $\sqrt{(\lambda \times G)}$, and
the plurality of in-phase auxiliary patterns are provided along a side constituting the thick line portion.

\* \* \* \* \*